US012563923B2

(12) United States Patent
Zhang et al.

(10) Patent No.: US 12,563,923 B2
(45) Date of Patent: Feb. 24, 2026

(54) DISPLAY SUBSTRATE THAT INCLUDES AN INITIALIZATION SIGNAL FILM LAYER WITH A PLURALITY OF PORTIONS AND SUB-PORTIONS, METHOD OF MANUFACTURING THE SAME AND DISPLAY DEVICE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Tiaomei Zhang, Beijing (CN); Haigang Qing, Beijing (CN); Yunsheng Xiao, Beijing (CN); Ziyang Yu, Beijing (CN); Zhongliu Yang, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 499 days.

(21) Appl. No.: 18/016,936

(22) PCT Filed: Jan. 29, 2022

(86) PCT No.: PCT/CN2022/075043
§ 371 (c)(1),
(2) Date: Jan. 19, 2023

(87) PCT Pub. No.: WO2023/142055
PCT Pub. Date: Aug. 3, 2023

(65) Prior Publication Data
US 2024/0130179 A1 Apr. 18, 2024

(51) Int. Cl.
*H10K 59/131* (2023.01)
*G09G 3/3233* (2016.01)
*H10K 59/12* (2023.01)

(52) U.S. Cl.
CPC ....... *H10K 59/131* (2023.02); *H10K 59/1201* (2023.02); *G09G 3/3233* (2013.01);
(Continued)

(58) Field of Classification Search
CPC ............. H10K 59/131; H10K 59/1201; H10K 59/1213; G09G 3/3233; G09G 2300/0819;
(Continued)

(56) References Cited

U.S. PATENT DOCUMENTS 10,962,850 B1 * 3/2021 Yang ................. G02F 1/136209
2010/0007647 A1 * 1/2010 Kubota ................ H10K 59/131
345/212
(Continued)

FOREIGN PATENT DOCUMENTS

CN 101436544 A 5/2009
CN 105140276 A 12/2015
(Continued)

*Primary Examiner* — William B Partridge
*Assistant Examiner* — David Paul Sedorook
(74) *Attorney, Agent, or Firm* — WHDA, LLP

(57) ABSTRACT

A display substrate includes: a base substrate, a plurality of sub-pixels arranged on the base substrate, a plurality of gate lines, and a plurality of first compensation gate patterns; the sub-pixel includes a sub-pixel driving circuit, and the sub-pixel driving circuit includes a compensation transistor; the compensation transistor includes a second compensation gate pattern, the first compensation gate pattern is located between a corresponding second compensation gate pattern and the base substrate, the first compensation gate pattern is coupled to a DC signal output terminal, and the second
(Continued)

compensation gate pattern is coupled to a corresponding gate line; the compensation transistor includes a compensation active layer, the compensation active layer is located between the first compensation gate pattern and the second compensation gate pattern, and the compensation active layer includes a compensation channel portion.

20 Claims, 15 Drawing Sheets

(52) U.S. Cl.
CPC .............. *G09G 2300/0819* (2013.01); *G09G 2300/0842* (2013.01); *G09G 2300/0861* (2013.01); *G09G 2320/0247* (2013.01)

(58) Field of Classification Search
CPC ... G09G 2300/0842; G09G 2300/0861; G09G 2320/0247; G09G 2310/0251; H01L 21/027
See application file for complete search history.

(56) References Cited

U.S. PATENT DOCUMENTS

| | | | | |
|---|---|---|---|---|
| 2015/0014641 A1* | 1/2015 | Jung | ...................... | H10D 86/60 |
| | | | | 257/40 |
| 2017/0373094 A1* | 12/2017 | Park | ................... | H10D 86/0231 |
| 2021/0249542 A1 | 8/2021 | Lee et al. | | |
| 2021/0367081 A1* | 11/2021 | Yan | ................... | H10D 30/6757 |
| 2022/0102583 A1* | 3/2022 | Baumheinrich | ... | G02B 6/12007 |
| 2022/0277691 A1* | 9/2022 | Wang | ................... | H10K 59/131 |
| 2022/0302238 A1* | 9/2022 | Zhou | ................... | H10K 59/131 |
| 2023/0070413 A1* | 3/2023 | Xu | ...................... | H10D 30/6755 |

FOREIGN PATENT DOCUMENTS

| | | |
|---|---|---|
| CN | 111681549 A | 9/2020 |
| CN | 109584803 B | 1/2021 |
| CN | 113257866 A | 8/2021 |
| CN | 113629127 A | 11/2021 |
| CN | 113690306 A | 11/2021 |
| CN | 113745254 A | 12/2021 |
| CN | 113920934 A | 1/2022 |

* cited by examiner

1

DISPLAY SUBSTRATE THAT INCLUDES AN INITIALIZATION SIGNAL FILM LAYER WITH A PLURALITY OF PORTIONS AND SUB-PORTIONS, METHOD OF MANUFACTURING THE SAME AND DISPLAY DEVICE

CROSS-REFERENCE TO RELATED APPLICATION

This application is the U.S. national phase of PCT Application No. PCT/CN2022/075043 filed on Jan. 29, 2022, which is incorporated herein by reference in its entirety.

TECHNICAL FIELD

The present disclosure relates to the field of display technology, in particular to a display substrate, a method of manufacturing the display substrate and a display device.

BACKGROUND

In recent years, with the rapid development of the display industry, rigid liquid crystal screens are gradually unable to meet people's needs. Therefore, organic light emitting diode displays, which are known for their flexibility, have emerged as the times require. Organic light emitting diode displays not only have good flexibility, but also have the advantages of thinness, low power consumption, fast response speed, wide viewing angle, etc., and are widely used in various fields.

SUMMARY

An object of the present disclosure is to provide a display substrate, a method of manufacturing the same and a display device.

In order to achieve the above-mentioned object, the present disclosure provides the following technical solutions.

In one aspect, the present disclosure provides in some embodiments a display substrate, including: a base substrate, a plurality of sub-pixels arranged on the base substrate, a plurality of gate lines, and a plurality of first compensation gate patterns; wherein the sub-pixel includes a sub-pixel driving circuit, and the sub-pixel driving circuit includes: a driving transistor and a compensation transistor; a first electrode of the compensation transistor is coupled to a second electrode of the driving transistor, and a second electrode of the compensation transistor is coupled to a gate electrode of the driving transistor; the compensation transistor includes a second compensation gate pattern, the first compensation gate pattern is located between a corresponding second compensation gate pattern and the base substrate, the first compensation gate pattern is coupled to a direct current (DC) signal output terminal, and the second compensation gate pattern is coupled to a corresponding gate line; the compensation transistor includes a compensation active layer, the compensation active layer is located between the first compensation gate pattern and the second compensation gate pattern, and the compensation active layer includes a compensation channel portion; an orthographic projection of the first compensation gate pattern on the base substrate at least partially overlaps an orthographic projection of the compensation channel portion on the base substrate; an orthographic projection of the second compensation gate pattern on the base substrate completely covers the orthographic projection of the compensation channel portion on the base substrate.

Optionally, the orthographic projection of the first compensation gate pattern on the base substrate completely cover the orthographic projection of the compensation channel portion on the base substrate.

Optionally, the orthographic projection of the first compensation gate pattern on the base substrate surrounds the orthographic projection of the second compensation gate pattern on the base substrate.

Optionally, the compensation active layer includes a first compensation channel portion, a second compensation channel portion and a compensation connection portion, the compensation connection portion is respectively coupled to the first compensation channel portion and the second compensation channel portion; the orthographic projection of the first compensation gate pattern on the base substrate at least partially overlaps an orthographic projection of the compensation connection portion on the base substrate.

Optionally, the compensation active layer further includes first lightly doped regions, and the first compensation channel portion is located between the first lightly doped regions, the second compensation channel portion is located between the first lightly doped regions.

Optionally, the display substrate further includes a plurality of power supply lines; the sub-pixel further includes a shielding pattern, the shielding pattern is coupled to the power supply line, and an orthographic projection of the shielding pattern on the base substrate at least partially overlaps the orthographic projection of the compensation connection portion on the base substrate.

Optionally, the sub-pixel further includes a first conductive connection portion, and the first conductive connection portion is respectively coupled to the gate electrode of the driving transistor and the second electrode of the compensation transistor; an orthographic projection of an end of the first conductive connection portion coupled to the second electrode of the compensation transistor on the base substrate is at least partially surrounded by the orthographic projection of the shielding pattern on the base substrate.

Optionally, the display substrate further includes a first initialization signal film layer, a plurality of first reset lines, and a plurality of first reset gate patterns; the sub-pixel driving circuit further includes: a first reset transistor, a first electrode of the first reset transistor is coupled to the first initialization signal film layer, and a second electrode of the first reset transistor is coupled to the gate electrode of the driving transistor; the first reset transistor includes a second reset gate pattern, and the first reset gate pattern is located between a corresponding second reset gate pattern and the base substrate; the first reset gate pattern is coupled to the DC signal output terminal, and the second reset gate pattern is coupled to a corresponding first reset line; the first reset transistor includes a first reset active layer, the first reset active layer is located between the first reset gate pattern and the second reset gate pattern, the first reset active layer includes a reset channel portion; the orthographic projection of the first reset gate pattern on the base substrate at least partially overlaps an orthographic projection of the reset channel portion on the base substrate; the orthographic projection of the second reset gate pattern on the base substrate completely covers the orthographic projection of the reset channel portion on the base substrate.

Optionally, the orthographic projection of the first reset gate pattern on the base substrate completely covers the orthographic projection of the reset channel portion on the base substrate.

3

Optionally, the orthographic projection of the first reset gate pattern on the base substrate surrounds the orthographic projection of the second reset gate pattern on the base substrate.

Optionally, the first reset active layer includes a first reset channel portion, a second reset channel portion and a reset connection portion, the reset connection portion is respectively coupled to the first reset channel portion and the second reset channel portion; the orthographic projection of the first reset gate pattern on the base substrate at least partially overlaps an orthographic projection of the reset connection portion on the base substrate.

Optionally, the first reset active layer further includes second lightly doped regions, and the first reset channel portion is located between the second lightly doped regions, and the second reset channel portion is located between the second lightly doped regions.

Optionally, the first initialization signal film layer includes a grid structure.

Optionally, the first initialization signal film layer includes a plurality of first initial portions and a plurality of second initial portions, and the first initial portion includes at least a portion extending along a first direction, the second initial portion includes at least a portion extending along a second direction, and the first direction intersects the second direction; the plurality of first initial portions are arranged along the second direction, and the plurality of second initial portions are respectively coupled to the plurality of first initial portions; the first electrode of the first reset transistor is coupled to a corresponding second initial portion.

Optionally, the second initial portion includes an initial main body portion and an initial protruding portion, and the initial main body portion includes at least a portion extending along the second direction, the initial protruding portion includes at least a portion extending along the first direction; the first electrode of the first reset transistor is coupled to the initial protruding portion.

Optionally, the initial main body portion includes a plurality of first sub-portions and a plurality of second sub-portions, the first sub-portion and the second sub-portion are arranged alternately, and the first sub-portion and the second sub-portion are at least partially staggered along the first direction; the second sub-portion is coupled to the initial protruding portion; an orthographic projection of the second sub-portion on the base substrate at least partially overlaps the orthographic projection of the compensation channel portion on the base substrate.

Optionally, the orthographic projection of the second sub-portion on the base substrate at least partially overlaps the orthographic projection of the compensating connection portion on the base substrate.

Optionally, the orthographic projection of the first initial portion on the base substrate at least partially overlaps the orthographic projection of the reset connection portion on the base substrate.

Optionally, the display substrate further includes a plurality of second initialization signal lines and a plurality of second reset lines; the sub-pixel driving circuit further includes a second reset transistor, a gate electrode of the second reset transistor is coupled to a corresponding second reset line, a first electrode of the second reset transistor is coupled to a corresponding second initialization signal line, and a second electrode of the second reset transistor is coupled to a corresponding light emitting element.

Optionally, the display substrate further includes a plurality of data lines, a plurality of power supply lines and a plurality of light emitting control lines; the sub-pixel driving circuit further includes a data writing-in transistor, a power supply control transistor, a light emitting control transistor and a storage capacitor; a gate electrode of the data writing-in transistor is coupled to a corresponding gate line, a first electrode of the data writing-in transistor is coupled to a corresponding data line, and a second electrode of the data writing-in transistor is coupled to the first electrode of the driving transistor; a gate electrode of the power supply control transistor is coupled to a corresponding light emitting control line, a first electrode of the power supply control transistor is coupled to a corresponding power supply line, and a second electrode of the power supply control transistor is coupled to the first electrode of the driving transistor; a gate electrode of the light emitting control transistor is coupled to the corresponding light emitting control line, a first electrode of the light emitting control transistor is coupled to the second electrode of the driving transistor, and a second electrode of the light emitting control transistor is coupled to a corresponding light emitting element; a first electrode plate of the storage capacitor is coupled to the gate electrode of the driving transistor, and a second electrode plate of the storage capacitor is coupled to the corresponding power supply line.

Optionally, the display substrate includes a light shielding layer, and a first light shielding portion in the light shielding layer is multiplexed as the first compensation gate pattern, a second light shielding portion in the light shielding layer is multiplexed as the first reset gate pattern.

Optionally, the display substrate further includes a display area and a peripheral area surrounding the display area; the display substrate further includes a power supply line, and the power supply line includes a portion located in the display area and a portion located in the peripheral area; the light shielding layer is coupled to the power supply line in the peripheral area.

In a second aspect, a display device includes the display substrate.

In a third aspect, a method of manufacturing the display substrate includes: forming the plurality of first compensation gate patterns and a plurality of first reset gate patterns included in the display substrate; forming the compensation active layer included in the compensation transistor and the first reset active layer included in the first reset transistor; forming the second compensation gate pattern included in the compensation transistor and the second reset gate pattern included in the first reset transistor; forming a first photoresist pattern and a second photoresist pattern, the first photoresist pattern covering the compensation channel portion and a first lightly doped region, and the second photoresist pattern covering the reset channel portion and a second lightly doped region; performing a first doping on the compensation active layer and the first reset active layer; removing the first photoresist pattern and the second photoresist pattern; performing a second doping on the compensation active layer and the first reset active layer.

BRIEF DESCRIPTION OF THE DRAWINGS

The drawings described herein are used to provide a further understanding of the present disclosure and constitute a part of the present disclosure. The schematic embodiments and their descriptions of the present disclosure are used to explain the present disclosure, and do not constitute an improper limitation of the present disclosure.

DETAILED DESCRIPTION

Figure 1:
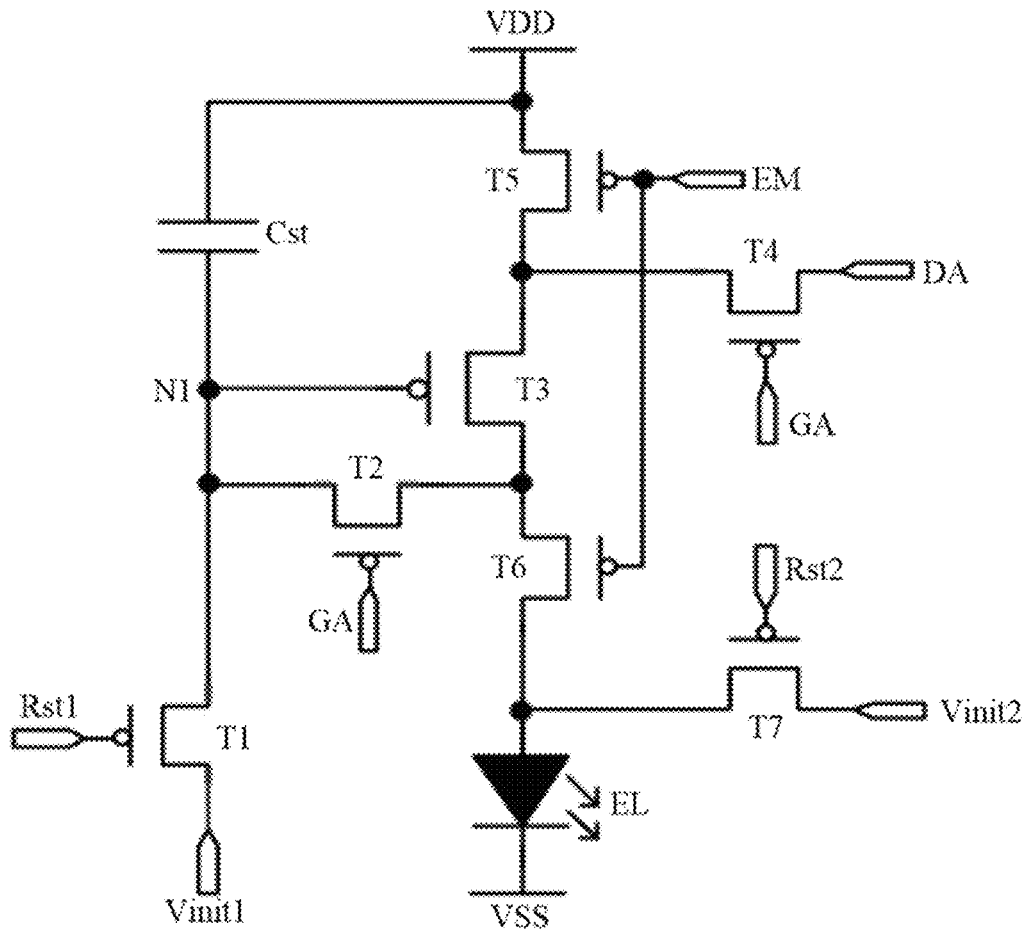
FIG. 1 is a schematic diagram of a circuit structure of a sub-pixel driving circuit provided by an embodiment of the present disclosure.

In order to further explain the display substrate, the method of manufacturing the same and display device provided by the embodiments of the present disclosure, the following will be described in detail with reference to the drawings of the disclosure.

The present disclosure provides a display substrate, which includes a sub-pixel driving circuit arranged in an array, and the sub-pixel driving circuit includes a driving transistor and a compensation transistor, and the compensation transistor is connected between the second electrode of the driving transistor and the gate electrode of the driving transistor. The compensation transistors include a double-gate transistor, and the compensation transistor is easily affected by other surrounding signals, so that the compensation transistors will leak when the display substrate is in the light emitting phase, which will cause flickering problems during the low-frequency display for the display substrate applied to the display screen.

As shown in FIG. 1, FIG. 2, FIG. 3, FIG. 7, FIG. 8 and FIG. 9, an embodiment of the present disclosure provides a display substrate, including: a base substrate, a plurality of sub-pixels arranged on the base substrate, and a plurality of gate lines GA, and a plurality of first compensation gate patterns 31; the sub-pixel includes a sub-pixel driving circuit, and the sub-pixel driving circuit includes: a driving transistor T3 and a compensation transistor T2;

A first electrode of the compensation transistor T2 is coupled to a second electrode of the driving transistor T3, and a second electrode of the compensation transistor T2 is coupled to a gate electrode T3-*g* of the driving transistor T3; the compensation transistor T2 includes a second compensation gate pattern 32, the first compensation gate pattern 31 is located between the corresponding second compensation gate pattern 32 and the base substrate, the first compensation gate pattern 31 is coupled to the DC signal output terminal, and the second compensation gate pattern 32 is coupled to the corresponding gate line GA;

The compensation transistor T2 includes a compensation active layer 21, the compensation active layer 21 is located between the first compensation gate pattern 31 and the second compensation gate pattern 32, and the compensation active layer 21 includes a compensation channel portion; an orthographic projection of the first compensation gate pattern 31 on the base substrate at least partially overlaps an orthographic projection of the compensation channel portion on the base substrate; an orthographic projection of the second compensation gate pattern 32 on the base substrate completely covers the orthographic projection of the compensation channel portion on the base substrate.

Exemplarily, the display substrate includes a plurality of sub-pixels, and the plurality of sub-pixel driving circuits included in the plurality of sub-pixels are arranged in an array. The plurality of sub-pixel driving circuits are divided into a plurality of rows of sub-pixel driving circuits and a plurality of columns of sub-pixel driving circuits. The plurality of rows of sub-pixel driving circuits are arranged along a second direction, and each row of sub-pixel driving circuits includes a plurality of sub-pixel driving circuits arranged along the first direction. The plurality of columns of sub-pixel driving circuits are arranged along a first direction, and each column of sub-pixel driving circuits includes a plurality of sub-pixel driving circuits arranged along the second direction. Exemplarily, the first direction intersects the second direction. For example: the first direction includes the horizontal direction, and the second direction includes the longitudinal direction.

Exemplarily, the sub-pixel includes a sub-pixel driving circuit and a light emitting element. The sub-pixel driving circuit is coupled to the anode of the light emitting element, and is used to provide a driving signal for the light emitting element to drive the light emitting element to emit light. Exemplarily, the sub-pixel driving circuit includes a 7T1C circuit (that is, 7 thin film transistors and one capacitor), but is not limited thereto.

Exemplarily, the display substrate further includes a plurality of gate lines GA, and the gate line GA includes at least a portion extending along the first direction. The plurality of gate lines GA correspond to the plurality of rows of sub-pixel driving circuits in a one-to-one manner. The second compensation gate pattern 32 of the compensation transistor T2 is coupled to the corresponding gate line GA, and receives the scanning signal provided by the gate driving circuit (GOA) provided in the peripheral area of the display substrate.

Exemplarily, the first compensation gate pattern 31 is coupled to a DC signal output terminal in the display substrate, and a stable DC signal is loaded on the first compensation gate pattern 31. Exemplarily, the power supply line VDD in the display substrate is a plurality of xed as the DC signal output terminal.

Exemplarily, the first compensation gate pattern 31 is made of metal material. The first compensation gate pattern 31 is made of the same material as the second compensation gate pattern 32, which can be made of metal molybdenum, but not limited thereto.

Exemplarily, the first compensation gate pattern 31, the second compensation gate pattern 32 and the compensation active layer 21 are stacked. The first compensation gate pattern 31 is located between the compensation active layer 21 and the base substrate. The second compensation gate pattern 32 is located on a side of the compensation active layer 21 away from the base substrate.

According to the specific structure of the above display substrate, in the display substrate provided by the embodiment of the present disclosure, the display substrate includes the first compensation gate pattern 31, and the compensation transistor T2 includes the second compensation gate pattern 32, so that the compensation transistor T2 is formed as a structure including a top gate and a bottom gate. The orthographic projection of the first compensation gate pattern 31 on the base substrate at least partially overlaps the orthographic projection of the compensation channel portion on the base substrate; the orthographic projection of the second compensation gate pattern 32 on the base substrate completely covers the orthographic projection of the compensation channel portion on the base substrate; so that the second compensation gate pattern 32 can receive corresponding scanning signals and control the compensation transistor T2 to work normally, the first compensation gate pattern 31 can shield and stabilize the voltage of the compensation transistor T2. Therefore, the influence of other signals on the compensation transistor T2 is eliminated, and the leakage of the compensation transistor T2 is avoided when the display substrate is in the light emitting phase, thereby avoiding the flickering problem of the display screen applied to the display substrate when displaying at a low frequency. The display screen applied to the display substrate provided by the embodiments of the present disclosure has a better display effect and greatly improves product performance.

Moreover, since the first compensation gate pattern 31 can be loaded with different DC voltage signals as required, under different grayscale brightness, matching signals can be provided to the first compensation gate pattern 31 for voltage stabilization, which can prevent the compensation transistor T2 from leaking more effectively when the display substrate is in the light emitting phase.

As shown in FIG. 1, FIG. 2, FIG. 3, FIG. 7, FIG. 8 and FIG. 9, in some embodiments, the orthographic projection of the first compensation gate pattern 31 on the base substrate completely cover the orthographic projection of the compensation channel portion on the base substrate.

The above setting method can better improve the voltage stabilizing effect, and more effectively avoid the leakage of the compensation transistor T2 when the display substrate is in the light emitting phase.

As shown in FIG. 1, FIG. 2, FIG. 3, FIG. 7, FIG. 8 and FIG. 9, in some embodiments, the orthographic projection of the first compensation gate pattern 31 on the base substrate surrounds the orthographic projection of the second compensation gate pattern 32 on the base substrate.

Exemplarily, the orthographic projection of the first compensation gate pattern 31 on the base substrate completely covers the orthographic projection of the second compensation gate pattern 32 on the base substrate.

The above setting method can fully consider the manufacturing process deviation, ensure that the orthographic projection of the first compensation gate pattern 31 on the base substrate can completely cover the orthographic projection of the compensation channel portion on the base substrate, and ensure that the compensation channel portion can be completely shielded by the first compensation gate pattern 31, so as to better improve the voltage stabilization effect and more effectively avoid the leakage of the compensation transistor T2 when the display substrate is in the light emitting phase.

As shown in FIG. 1, FIG. 2, FIG. 3, FIG. 7, FIG. 8 and FIG. 9, in some embodiments, the compensation active layer 21 includes a first compensation channel portion 210, a second compensation channel portion 211 and a compensation connection portion 212, the compensation connection portion 212 is respectively coupled to the first compensation channel portion 210 and the second compensation channel portion 211;

The orthographic projection of the first compensation gate pattern 31 on the base substrate at least partially overlaps the orthographic projection of the compensation connection portion 212 on the base substrate.

Exemplarily, the conductivity of the compensation connection portion 212 is better than that of the first compensation channel portion 210 and the second compensation channel portion 211.

Exemplarily, the first compensation channel portion 210, the second compensation channel portion 211 and the compensation connection portion 212 are formed into an integral structure.

A compensation connection portion 212 is formed as a compensation intermediate node of the compensation transistor T2. The orthographic projection of the first compensation gate pattern 31 on the base substrate at least partially overlaps the orthographic projection of the compensation connection portion 212 on the base substrate; so that the parasitic capacitance at the compensation intermediate node increases, which is beneficial to improve the leakage problem of the compensation transistor T2.

As shown in FIG. 1, FIG. 2, FIG. 4, FIG. 8 and FIG. 13, in some embodiments, the compensation active layer 21 further includes a first lightly doped region 41, and the first compensation channel portion 210 is located between the first lightly doped regions 41, the second compensation channel portion 211 is located between the first lightly doped regions 41.

Exemplarily, a part of the first lightly doped region 41 is located between the compensation connection portion 212 and the first compensation channel portion 210.

Exemplarily, a part of the first lightly doped region 41 is located between the compensation connection portion 212 and the second compensation channel portion 211.

Exemplarily, the first lightly doped region 41 is formed by performing P-type doping.

The compensation active layer 21 further includes first lightly doped regions 41, the first compensation channel portion 210 is located between the first lightly doped regions 41, and the second compensation channel portion 211 is located between the first lightly doped regions 41, the channel resistance of the compensation active layer 21 in the first lightly doped regions 41 is effectively improved, and the leakage problem of the compensation transistor T2 is improved, thereby effectively improving low frequency flicker problem.

Figure 5:
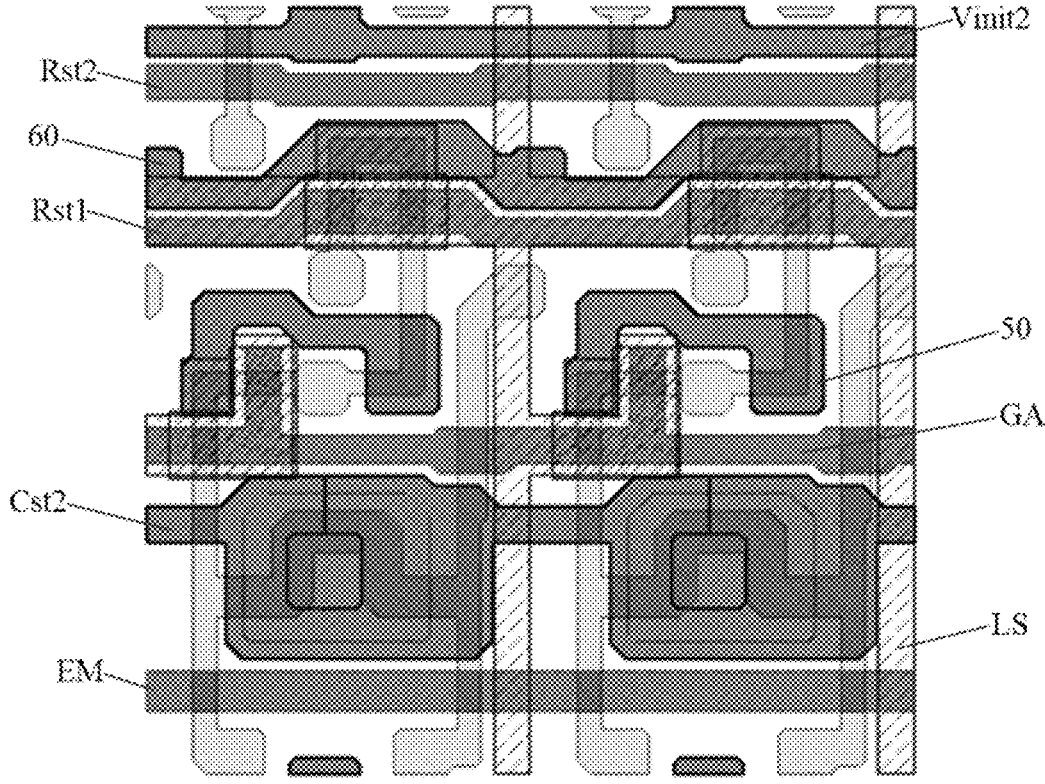
FIG. 5 is a schematic layout diagram of a second gate metal layer formed on the basis of FIG. 3.
Figure 6:
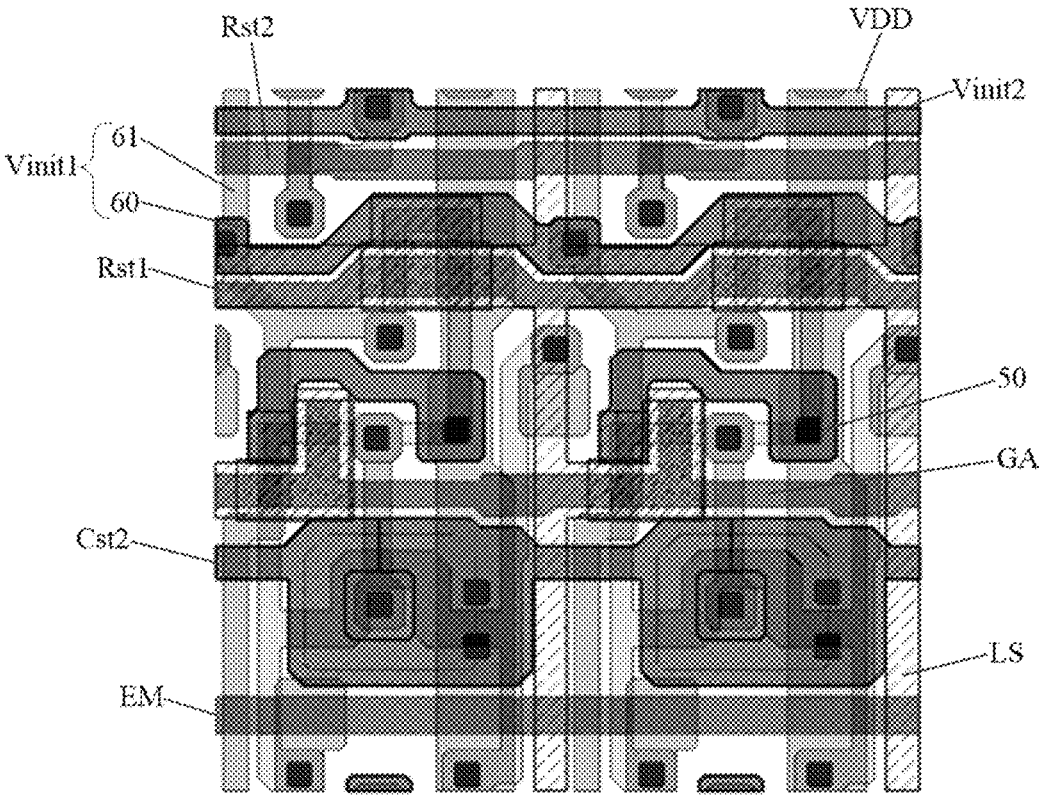
FIG. 6 is a schematic layout diagram of a first source-drain metal layer formed on the basis of FIG. 5.
Figure 10:
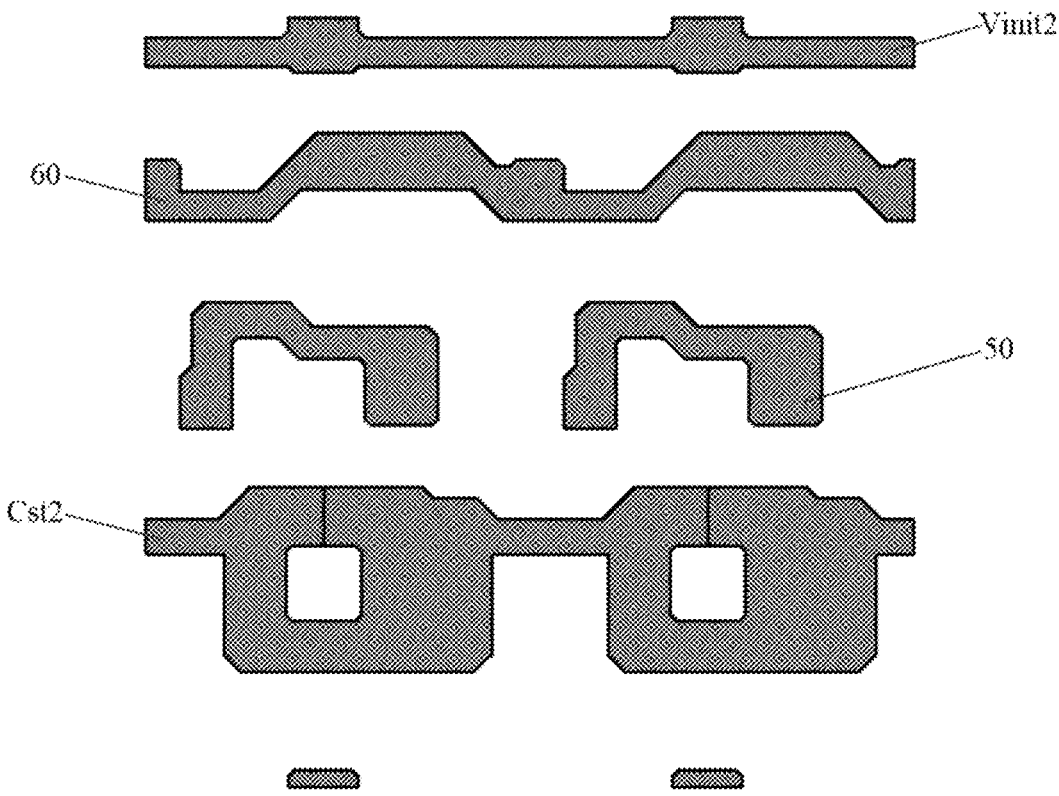
FIG. 10 is a schematic layout diagram of the second gate metal layer in FIG. 2.

As shown in FIG. 5, FIG. 6 and FIG. 10, in some embodiments, the display substrate further includes a plurality of power supply lines VDD; the sub-pixel further includes the shielding pattern 50, the shielding pattern 50 is coupled to the power supply line VDD, and the orthographic projection of the shielding pattern 50 on the base substrate at least partially overlaps the orthographic projection of the compensation connection portion 212 on the base substrate.

Exemplarily, the plurality of power supply lines VDD correspond to the plurality of columns of sub-pixel driving circuits in a one-to-one manner. The power supply line VDD includes at least a portion extending in the second direction.

Exemplarily, there is an overlapping area between the orthographic projection of the shielding pattern 50 on the base substrate and the orthographic projection of the power supply line VDD on the base substrate, and the shielding pattern 50 and the power supply line VDD are coupled through a via hole in the overlapping area.

Exemplarily, the orthographic projection of the shielding pattern 50 on the base substrate covers the orthographic projection of the compensation connection portion 212 on the base substrate.

The orthographic projection of the shielding pattern 50 on the base substrate at least partly overlaps the orthographic projection of the compensation connection portion 212 on the base substrate, so that the shielding pattern 50 can perform voltage stabilization on the compensation transistor T2, which further improves the leakage problem of the compensation transistor T2, thereby effectively improving the low frequency flicker problem.

Both the shielding pattern 50 and the first compensation gate pattern 31 perform shielding and voltage stabilization on the compensation connection portion, which further improves the leakage problem of the compensation transistor T2, thereby effectively protecting the potential of the gate electrode T3-*g* of the driving transistor T3.

As shown in FIG. 5, FIG. 6, FIG. 10 and FIG. 11, in some embodiments, the sub-pixel further includes a first conductive connection portion 11, and the first conductive connection portion 11 is respectively coupled to the gate electrode T3-*g* of the driving transistor T3 and the second electrode of the compensation transistor T2;

The orthographic projection of an end of the first conductive connection portion 11 coupled to the second electrode of the compensation transistor T2 on the base substrate is at least partially surrounded by the orthographic projection of the shielding pattern 50 on the base substrate.

Exemplarily, an end of the first conductive connection portion 11 coupled to the second electrode of the compensation transistor T2 forms an N1 node.

Exemplarily, the orthographic projection of an end of the first conductive connection portion 11 coupled to the second electrode of the compensation transistor T2 on the base substrate is partially surrounded by the orthographic projection of the shielding pattern 50 on the base substrate.

Exemplarily, at least part of the orthographic projection of the shielding pattern 50 on the base substrate is located between the orthographic projection of the first reset active layer 20 on the base substrate and the orthographic projection of the gate electrode T3-*g* of the driving transistor T3.

Exemplarily, at least part of the orthographic projection of the shielding pattern 50 on the base substrate is located between the orthographic projection of the N1 node on the base substrate and the orthographic projection of the data line DA on the base substrate.

The orthographic projection of the end of the first conductive connection portion 11 coupled to the second electrode of the compensation transistor T2 on the base substrate is at least partially surrounded by the orthographic projection of the shielding pattern 50 on the base substrate, so that the N1 node is separated from other surrounding signals, which has a good shielding effect on the N1 node, prevents the N1 node from interference by other surrounding signals, and thus improves the poor display crosstalk.

As shown in FIG. 1, FIG. 2, FIG. 3, and FIG. 6 to FIG. 9, in some embodiments, the display substrate further includes a first initialization signal film layer Vinit1, a plurality of first reset lines Rst1, and a plurality of first reset gate patterns 33; the sub-pixel driving circuit further includes: a first reset transistor T1, the first electrode of the first reset transistor T1 is coupled to the first initialization signal film layer Vinit1, and the second electrode of the first reset transistor T1 is coupled to the gate electrode T3-*g* of the driving transistor T3; the first reset transistor T1 includes a second reset gate pattern 34, and the first reset gate pattern 33 is located between the corresponding second reset gate pattern 34 and the base substrate; the first reset gate pattern 33 is coupled to the DC signal output terminal, and the second reset gate pattern 34 is coupled to the corresponding first reset line Rst1;

The first reset transistor T1 includes a first reset active layer 20, the first reset active layer 20 is located between the first reset gate pattern 33 and the second reset gate pattern 34, the first reset active layer 20 includes a reset channel portion; the orthographic projection of the first reset gate pattern 33 on the base substrate at least partially overlaps the orthographic projection of the reset channel portion on the base substrate; the orthographic projection of the second reset gate pattern 34 on the base substrate completely covers the orthographic projection of the reset channel portion on the base substrate.

Exemplarily, the first initialization signal film layer Vinit1 is used to transmit the first initialization signal. The first reset line Rst1 is used to transmit the first reset signal.

Exemplarily, the first reset line Rst1 includes at least a portion extending along the first direction. The plurality of first reset lines Rst1 correspond to the plurality of rows of sub-pixel driving circuits in a one-to-one manner.

The second reset gate pattern 34 of the reset transistor is coupled to the corresponding first reset line Rst1, and receives a scanning signal provided by a gate driving circuit (GOA) provided in the peripheral area of the display substrate.

Exemplarily, the first reset gate pattern 33 is coupled to a DC signal output terminal in the display substrate, and a stable DC signal is loaded on the first reset gate pattern 33. Exemplarily, the power supply line VDD in the display substrate is multiplexed as the DC signal output terminal.

Exemplarily, the first reset gate pattern 33 is made of a metal material. The first reset gate pattern 33 is made of the same material as the second reset gate pattern 34, which can be made of metal molybdenum, but not limited thereto.

Exemplarily, the first reset gate pattern 33, the second reset gate pattern 34 and the reset active layer are stacked. The first reset gate pattern 33 is located between the first reset active layer 20 and the base substrate. The second reset gate pattern 34 is located on the side of the first reset active layer 20 away from the base substrate.

In the display substrate provided in the above embodiments, the display substrate includes the first reset gate pattern 33, and the first reset transistor T1 includes the second reset gate pattern 34, so that the first reset transistor T1 is formed in a structure including a top gate and a bottom gate. The orthographic projection of the first reset gate pattern 33 on the base substrate at least partially overlaps the orthographic projection of the reset channel portion on the base substrate; the orthographic projection of the second reset gate pattern 34 on the base substrate completely covers the orthographic projection of the reset channel portion on the base substrate; so that the second reset gate pattern 34 can receive corresponding scanning signals and control the first reset transistor T1 to work normally, the first reset gate pattern 33 can shield and stabilize the voltage of the first reset transistor T1. Therefore, the influence of other surrounding signals on the first reset transistor T1 is eliminated, and the leakage of the first reset transistor T1 is avoided when the display substrate is in the light emitting phase, thereby avoiding the flickering problem of the display screen applied to the display substrate during low frequency display. The display screen applied to the display substrate provided by the embodiments of the present disclosure has a better display effect and greatly improves product performance.

Moreover, since the first reset gate pattern 33 can be loaded with different DC voltage signals as required, under different gray scale brightness, matching signals can be provided to the first reset gate pattern 33 for voltage stabilization, which can efficiently avoid leakage of the reset transistor when the display substrate is in the light emitting phase.

As shown in FIG. 1, FIG. 2, FIG. 3, FIG. 6 to FIG. 9, in some embodiments, the orthographic projection of the first reset gate pattern 33 on the base substrate completely covers the orthographic projection of the reset channel portion on the base substrate.

The above setting method can better improve the voltage stabilizing effect, and more effectively avoid the leakage of the first reset transistor T1 when the display substrate is in the light emitting phase.

As shown in FIG. 1, FIG. 2, FIG. 3, FIG. 6 to FIG. 9, in some embodiments, the orthographic projection of the first reset gate pattern 33 on the base substrate surrounds the orthographic projection of the second reset gate pattern 34 on the base substrate.

Exemplarily, the orthographic projection of the first reset gate pattern 33 on the base substrate completely covers the orthographic projection of the second reset gate pattern 34 on the base substrate.

The above setting method can fully consider the manufacturing process deviation, ensure that the orthographic projection of the first reset gate pattern 33 on the base substrate can completely cover the orthographic projection of the reset channel portion on the base substrate, and ensure that the reset channel portion can be completely shielded by the first reset gate pattern 33, so as to better improve the voltage stabilization effect, and more effectively avoid the leakage of the first reset transistor T1 when the display substrate is in the light emitting phase.

As shown in FIG. 1, FIG. 2, FIG. 3, FIG. 6 to FIG. 9, in some embodiments, the first reset active layer 20 includes a first reset channel portion 201, a second reset channel portion 202 and a reset connection portion 203, the reset connection portion 203 is respectively coupled to the first reset channel portion 201 and the second reset channel portion 202;

The orthographic projection of the first reset gate pattern 33 on the base substrate at least partially overlaps the orthographic projection of the reset connection portion 203 on the base substrate.

Exemplarily, the conductive performance of the reset connection portion 203 is better than that of the first reset channel portion 201 and the second reset channel portion 202.

Exemplarily, the first reset channel portion 201, the second reset channel portion 202 and the reset connection portion 203 are formed into an integral structure.

The reset connection portion 203 is formed as a reset intermediate node of the first reset transistor T1. The orthographic projection of the first reset gate pattern 33 on the base substrate at least partially overlaps the orthographic projection of the reset connection portion 203 on the base substrate; so that the parasitic capacitance at the reset intermediate node increases, it is beneficial to improve the leakage problem of the first reset transistor T1.

Please refer to FIG. 1, FIG. 2, FIG. 4, FIG. 8 and FIG. 13. In some embodiments, the first reset active layer 20 further includes a second lightly doped region 42, and the first reset channel portion 201 is located between the second lightly doped regions 42, and the second reset channel portion 202 is located between the second lightly doped regions 42.

Exemplarily, a part of the second lightly doped region 42 is located between the reset connection portion 203 and the first reset channel portion 201.

Exemplarily, a part of the second lightly doped region 42 is located between the reset connection portion 203 and the second reset channel portion 202.

Exemplarily, the second lightly doped region 42 is formed by P-type doping.

The first reset active layer 20 further includes second lightly doped regions 42, the first reset channel portion 201 is located between the second lightly doped regions 42, and the second reset channel portion 202 is located between the second lightly doped regions 42, which effectively increases the channel resistance of the first reset active layer 20 in the second lightly doped regions 42, and improves the leakage problem of the first reset transistor T1, thus effectively improving the low frequency flicker problem.

As shown in FIG. 6, in some embodiments, the first initialization signal film layer Vinit1 includes a grid structure.

The above setting method is beneficial to reduce the loading generated by the first initialization signal film layer Vinit1 when transmitting the first initialization signal, so that the initialization speed of the N1 node is faster, thereby reducing the charging influence of the loading of the first initialization signal on the N1 node.

Figure 11:
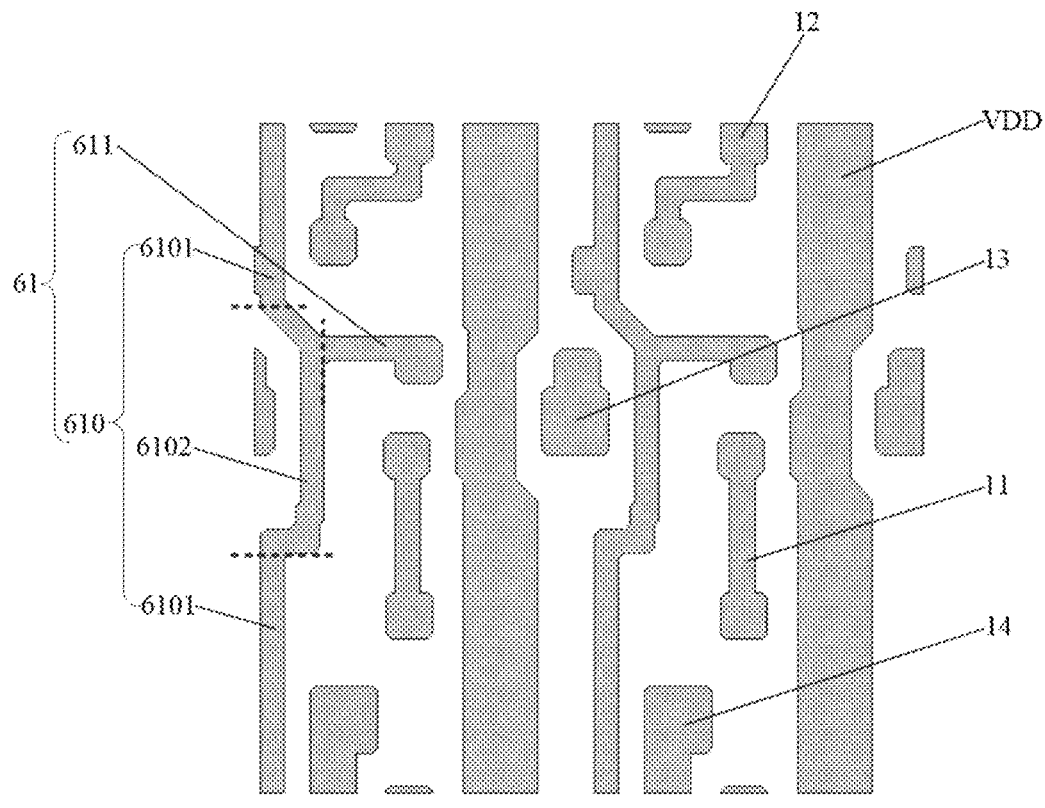
FIG. 11 is a schematic layout diagram of the first source-drain metal layer in FIG. 2.

As shown in FIG. 6, FIG. 10 and FIG. 11, in some embodiments, the first initialization signal film layer Vinit1 includes a plurality of first initial portions 60 and a plurality of second initial portions 61, and the first initial portion 60 includes at least a portion extending along a first direction, the second initial portion 61 includes at least a portion extending along a second direction, and the first direction intersects the second direction;

The plurality of first initial portions 60 are arranged along the second direction, and the second initial portions 61 are respectively coupled to the plurality of first initial portions 60; the first electrode of the first reset transistor T1 is coupled to the corresponding second initial portion 61.

Exemplarily, the plurality of first initial portions 60 correspond to the plurality of rows of sub-pixel driving circuits in a one-to-one manner. The plurality of second initial portions 61 correspond to the plurality of columns of sub-pixel driving circuits in a one-to-one manner.

Exemplarily, the first initial portion 60 and the second initial portion 61 are arranged in different layers.

Exemplarily, there is an overlapping area between the orthographic projection of the first initial portion 60 on the base substrate and the orthographic projection of the second initial portion 61 on the base substrate, and the first initial portion 60 is coupled to the second initial portion 61 through a via hole located in the overlapping area.

Exemplarily, there is an overlapping area between the orthographic projection of the first electrode of the first reset transistor T1 on the base substrate and the orthographic projection of the corresponding second initial portion 61 on the base substrate, the first electrode of the first reset transistor T1 is coupled to the corresponding second initial portion 61 through a via hole located in the overlapping area.

As shown in FIG. 6, FIG. 10 and FIG. 11, in some embodiments, the second initial portion 61 includes an initial main body portion 610 and an initial protruding portion 611, and the initial main body portion 610 includes at least a portion extending along the second direction, the initial protruding portion 611 includes at least a portion extending along the first direction; the first electrode of the first reset transistor T1 is coupled to the initial protruding portion 611.

Exemplarily, there is an overlapping area between the orthographic projection of the first electrode of the first reset transistor T1 on the base substrate and the orthographic projection of the initial protruding portion 611 on the base substrate, and the first electrode of the first reset transistor T1 is coupled to the corresponding initial protruding portion 611 through a via hole located in the overlapping area.

Exemplarily, at least part of the orthographic projection of the initial protruding portion 611 on the base substrate is located between the orthographic projection of the shielding pattern 50 on the base substrate and the orthographic projection of the first reset line Rst1 on the base substrate.

The above setting method is beneficial to reduce the layout difficulty of the display substrate and ensure a better connection between the first electrode of the first reset transistor T1 and the first initialization signal film layer Vinit1.

As shown in FIG. 2, FIG. 6, FIG. 10 and FIG. 11, in some embodiments, the initial main body portion 610 includes a plurality of first sub-portions 6101 and a plurality of second sub-portions 6102, the first sub-portion 6101 and the second sub-portion 6102 are arranged alternately, and the first sub-portion 6101 and the second sub-portion 6102 are at least partially staggered along the first direction;

The second sub-portion 6102 is coupled to the initial protruding portion 611; the orthographic projection of the second sub-portion 6102 on the base substrate at least partially overlaps the orthographic projection of the compensation channel portion on the base substrate.

Exemplarily, the first sub-portion 6101 and the second sub-portion 6102 are at least partially staggered along the first direction. The first sub-portion 6101 and the second sub-portion 6102 are at least partially staggered along the second direction.

Exemplarily, the first sub-portion 6101, the second sub-portion 6102 and the initial protruding portion 611 are formed into an integral structure.

Exemplarily, the orthographic projection of the first sub-portion 6101 on the base substrate partially overlaps the orthographic projection of the second initialization signal line Vinit2 on the base substrate. The orthographic projection of the first sub-portion 6101 on the base substrate partially overlaps the orthographic projection of the second reset line Rst2 on the base substrate. The orthographic projection of the first sub-portion 6101 on the base substrate partially overlaps the orthographic projection of the first initial portion 60 on the base substrate. A part of the orthographic projection of the first sub-portion 6101 on the base substrate is located between the orthographic projection of the data line DA on the base substrate and the orthographic projection of the second reset active layer 26 included in the second reset transistor T7 on the base substrate. The orthographic projection of the first sub-portion 6101 on the base substrate partially overlaps the orthographic projection of the second electrode plate Cst2 of the storage capacitor Cst on the base substrate. The orthographic projection of the first sub-portion 6101 on the base substrate partially overlaps the orthographic projection of the light emitting control line EM on the base substrate. A part of the orthographic projection of the first sub-portion 6101 on the base substrate is located between the orthographic projection of the data line DA on the base substrate, and the orthographic projection of the light emitting control active layer 25 included in the light emitting control transistor T6 on the base substrate.

Exemplarily, the orthographic projection of the second sub-portion 6102 on the base substrate at least partially overlaps the orthographic projection of the first compensation channel portion 210 on the base substrate.

In the above setting, the orthographic projection of the second sub-portion 6102 on the base substrate at least partially overlaps the orthographic projection of the compensation channel portion on the base substrate, which further enhances the shielding effect on the compensation channel portion. As a result, the leakage problem of the compensation transistor T2 is better improved.

The second initial portion 61 includes the first sub-portion 6101, the second sub-portion 6102 and the initial protruding portion 611, so that the second initial portion 61 is formed into a three-pronged structure design, after the first reset transistor T1 is turned on, the second initial portion 61 may directly write the first initialization signal to the N1 node. Therefore, for display products with high frequency requirements, this design can enable the display screen to initialize the N1 point in a shorter time, so that the initialized state of each sub-pixel on the display screen can be consistent in a shorter time, thereby improving the display uniformity.

As shown in FIG. 2, FIG. 6, FIG. 8, FIG. 10 and FIG. 11, in some embodiments, the orthographic projection of the second sub-portion 6102 on the base substrate at least partially overlaps the orthographic projection of the compensating connection portion 212 on the base substrate.

The above arrangement further enhances the shielding effect on the compensation transistor T2, and better improves the leakage problem of the compensation transistor T2.

As shown in FIG. 2, FIG. 6, FIG. 8, FIG. 10 and FIG. 11, in some embodiments, the orthographic projection of the first initial portion 60 on the base substrate at least partially overlaps the orthographic projection of the reset connection portion 203 on the base substrate.

The above setting method further enhances the shielding effect on the first reset transistor T1, and better improves the leakage problem of the first reset transistor T1.

The above setting method enables the reset connection portion 203 to be shielded and stabilized by the first initial portion 60 above the reset connection portion 203 and the first reset gate pattern 33 below the reset connection portion 203 at the same time, which further protects the first reset transistor T1 and improves the leakage problem of the first reset transistor T1, further stabilizes the potential of the N1 node.

Figure 2:
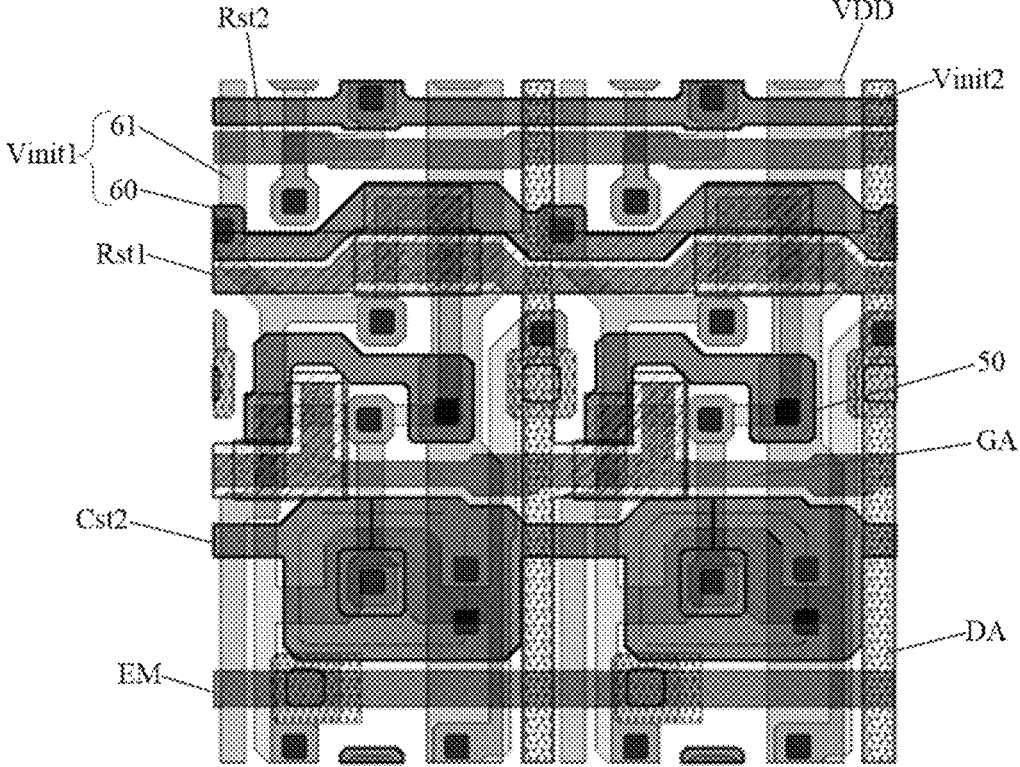
FIG. 2 is a schematic layout diagram of two sub-pixel driving circuits provided by an embodiment of the present disclosure.
Figure 3:
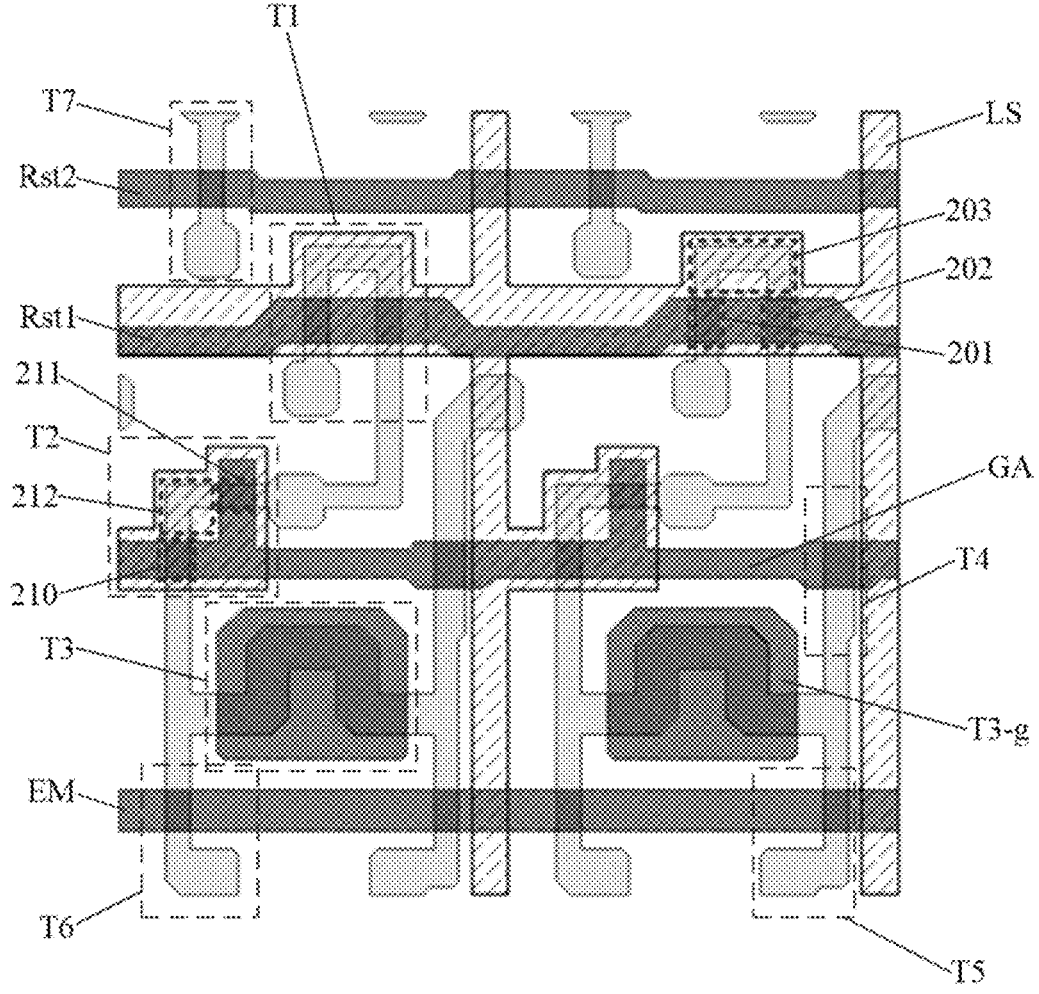
FIG. 3 is a schematic layout diagram of a light shielding layer, an active layer, and a first gate metal layer in FIG. 2.
Figure 4:
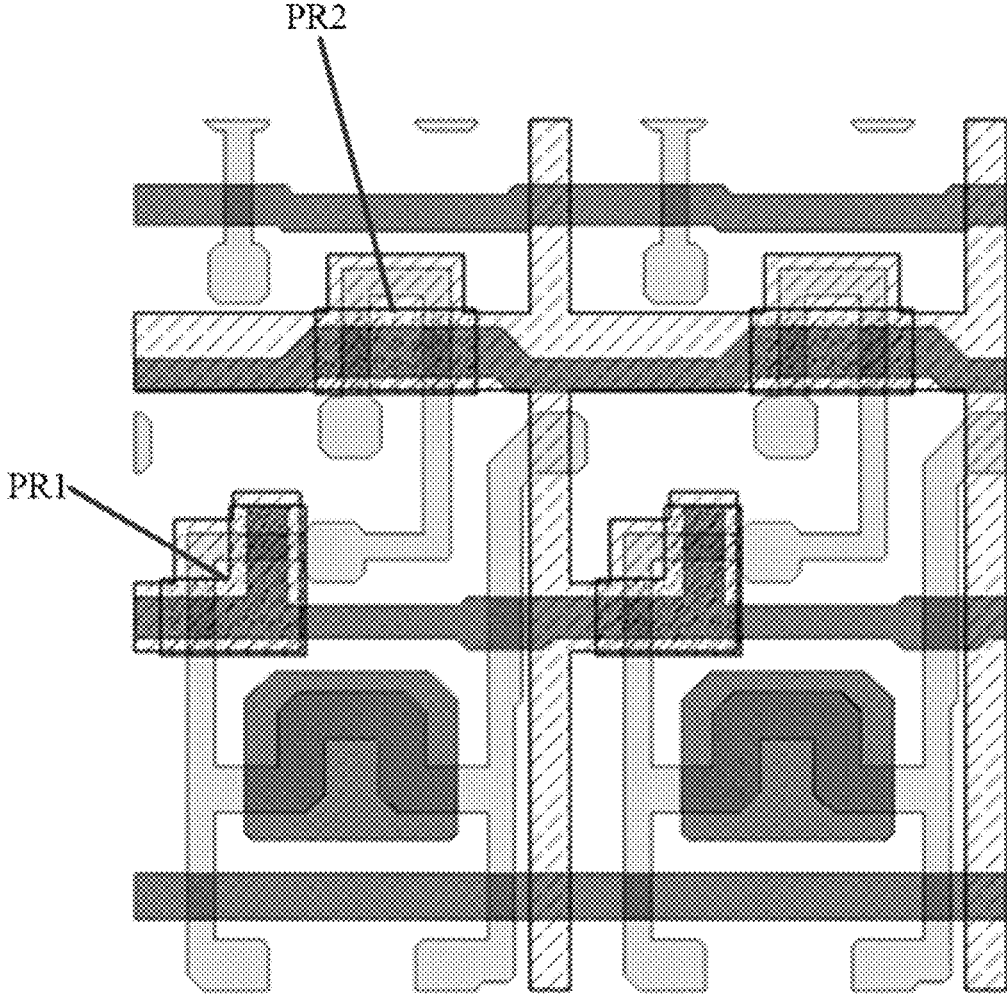
FIG. 4 is the schematic diagram of the position of the first photoresist pattern and the second photoresist pattern formed on the basis of FIG. 3.

As shown in FIGS. 1 to 3, in some embodiments, the display substrate further includes a plurality of second initialization signal lines Vinit2 and a plurality of second reset lines Rst2; the sub-pixel driving circuit further includes a second reset transistor T7, the gate electrode of the second reset transistor T7 is coupled to the corresponding second reset line Rst2, the first electrode of the second reset transistor T7 is coupled to the corresponding second initialization signal line Vinit2, and the second electrode of the second reset transistor T7 is coupled to the corresponding light emitting element.

Exemplarily, the sub-pixel further includes a light emitting element EL, and a cathode of the light emitting element EL is connected to a negative power supply signal VSS.

Exemplarily, the plurality of second reset lines Rst2 correspond to the plurality of rows of sub-pixel driving circuits in a one-to-one manner. The plurality of second initialization signal lines Vinit2 correspond to the plurality of rows of sub-pixel driving circuits in a one-to-one manner.

Exemplarily, the second reset line Rst2 includes at least a portion extending along the first direction. The second initialization signal line Vinit2 includes at least a portion extending along the first direction.

Exemplarily, the second reset line Rst2 is used to provide a second reset signal, and the second initialization signal line Vinit2 is used to provide a second initialization signal. The second reset transistor T7 is used to transmit the second initialization signal to the anode of the light emitting element under the control of the second reset signal.

In the display substrate provided in the above embodiment, the second reset transistor T7 is coupled to the second reset line Rst2 and the second initialization signal line Vinit2 respectively, so that the second reset transistor T7 can be independently controlled by the gate driving circuit (GOA circuit), the second reset transistor T7 can be in the on state in all phases other than the light emitting phase, and can realize repeated initializations on the anode of the light emitting element, the initialization of the anode is more sufficient, so that the initial state of light emitting of each sub-pixel is as consistent as possible, thereby improving the display effect of the display screen.

In the display substrate provided in the above embodiment, by setting the second reset transistor T7 to be coupled to the second reset line Rst2 and the second initialization signal line Vinit2 respectively, the first reset transistor T1 and the second reset transistor T7 can be controlled independently without affecting each other.

As shown in FIG. 1 to FIG. 6, FIG. 8 to FIG. 12, in some embodiments, the display substrate further includes a plurality of data lines DA, a plurality of power supply lines VDD and a plurality of light emitting control lines EM;

The sub-pixel driving circuit further includes a data writing-in transistor T4, a power supply control transistor T5, a light emitting control transistor T6 and a storage capacitor Cst;

The gate electrode of the data writing-in transistor T4 is coupled to the corresponding gate line GA, the first electrode of the data writing-in transistor T4 is coupled to the corresponding data line DA, and the second electrode of the data writing-in transistor T4 is coupled to the first electrode of the driving transistor T3;

The gate electrode of the power supply control transistor T5 is coupled to the corresponding light emitting control line EM, the first electrode of the power supply control transistor T5 is coupled to the corresponding power supply line VDD, and the second electrode of the power supply control transistor T5 is coupled to the first electrode of the driving transistor T3;

The gate electrode of the light emitting control transistor T6 is coupled to the corresponding light emitting control line EM, the first electrode of the light emitting control transistor T6 is coupled to the second electrode of the driving transistor T3, and the second electrode of the light emitting control transistor T6 is coupled to the corresponding light emitting element;

The first electrode plate Cst1 of the storage capacitor Cst is coupled to the gate electrode T3-g of the driving transistor T3, and the second electrode plate Cst2 of the storage capacitor Cst is coupled to the corresponding power supply line VDD.

Exemplarily, the plurality of data lines DA correspond to the plurality of columns of sub-pixel driving circuits in a one-to-one manner. The plurality of power supply lines VDD correspond to the plurality of columns of sub-pixel driving circuits in a one-to-one manner. The plurality of light emitting control lines EM correspond to the plurality of rows of sub-pixel driving circuits in a one-to-one manner.

In more detail, the sub-pixel driving circuit includes a first reset transistor T1, a compensation transistor T2, a driving transistor T3, a data writing-in transistor T4, a power supply control transistor T5, a light emitting control transistor T6, a second reset transistor T7 and a storage capacitor Cst.

When the sub-pixel driving circuit with the above structure is in operation, each working period includes a first reset phase, a writing-in compensation phase and a light emitting phase.

In the reset phase, the first reset signal inputted by the first reset line Rst1 is at an active level, the first reset transistor T1 is turned on, and the first initialization signal transmitted by the first initialization signal film layer Vinit1 is inputted to the gate electrode T3-g of the driving transistor T3, so that the gate-source voltage Vgs maintained on the driving transistor T3 in the previous frame is cleared, and the gate electrode T3-g of the driving transistor T3 is reset. The second reset signal inputted by the second reset line Rst2 is at an active level, and the second reset transistor T7 is controlled to be turned on, and the second initialization signal inputted by the second initialization signal line Vinit2 is inputted to the anode of the light emitting element EL to initialize the anode, to control the light emitting element EL not to emit light.

In the writing-in compensation phase, the first reset signal is at an inactive level, the first reset transistor T1 is turned off, the gate scanning signal inputted by the gate line GA is at an active level, and the compensation transistor T2 and the data writing transistor T4 are controlled to be turned on, the data signal is written into the data line DA and transmitted to the first electrode of the driving transistor T3 through the data writing-in transistor T4. At the same time, the compensation transistor T2 and the data writing-in transistor T4 are turned on, so that the driving transistor T3 is formed into a diode structure. Therefore, the compensation transistor T2, the driving transistor T3 and the data writing-in transistor T4 work together to realize the threshold voltage compensation of the driving transistor T3. When the compensation time is long enough, the potential of the gate electrode T3-g of the driving transistor T3 can be controlled to reach Vdata+Vth, where Vdata represents the voltage value of the data signal, and Vth represents the threshold voltage of the driving transistor T3. The second reset signal inputted by the second reset line Rst2 continues to be at an active level, and the second reset transistor T7 is controlled to be turned on, and the second initialization signal inputted by the second initialization signal line Vinit2 is inputted to the anode of the light emitting element EL, and the anode is initialized to control the light emitting element EL not to emit light.

In the light emitting phase, the light emitting control signal written by the light emitting control line EM is at an active level, and the power supply control transistor T5 and the light emitting control transistor T6 are controlled to be turned on, so that the power supply signal transmitted by the power supply line VDD is inputted to the first electrode of the driving transistor T3. At the same time, since the gate electrode T3-g of the driving transistor T3 is maintained at Vdata+Vth, so that the driving transistor T3 is turned on, and the gate-source voltage corresponding to the driving transistor T3 is Vdata+Vth−VDD, wherein VDD is the voltage value corresponding to the power supply signal, the leakage current generated based on the gate-source voltage flows to the anode of the corresponding light emitting element EL, to drive the corresponding light emitting element EL to emit light. The second reset signal inputted by the second reset line Rst2 is at an inactive level to control the second reset transistor T7 to be turned off.

Figure 12:
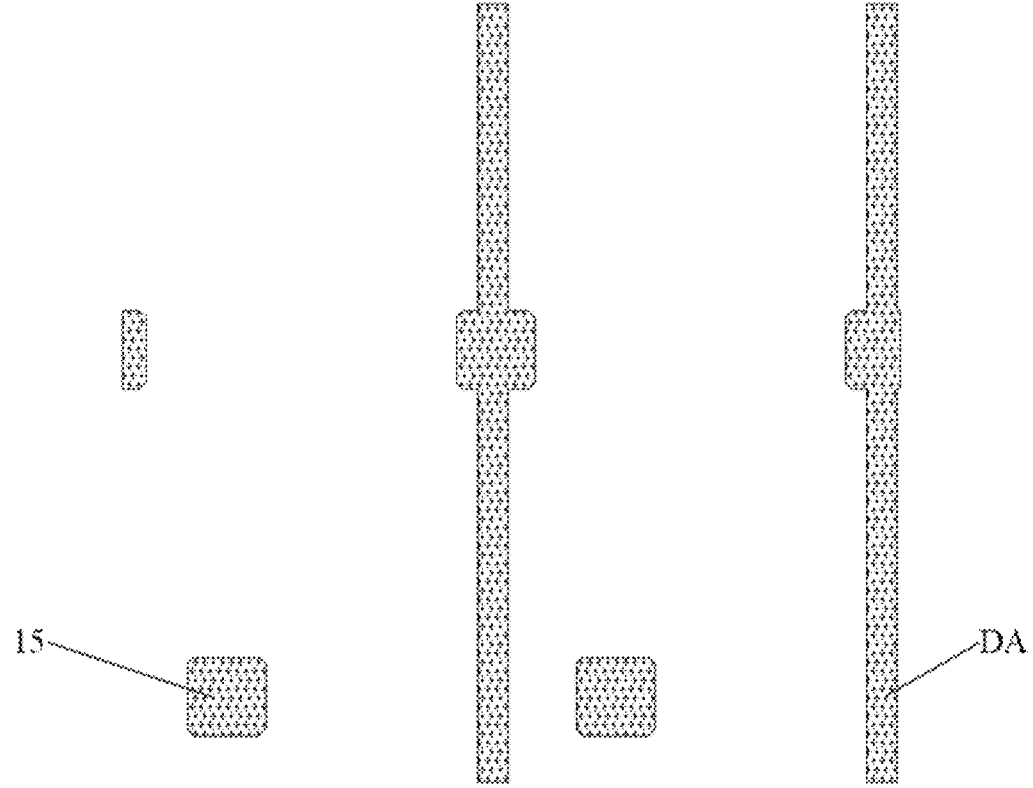
FIG. 12 is a schematic layout diagram of a second source-drain metal layer in FIG. 2.
Figure 13:
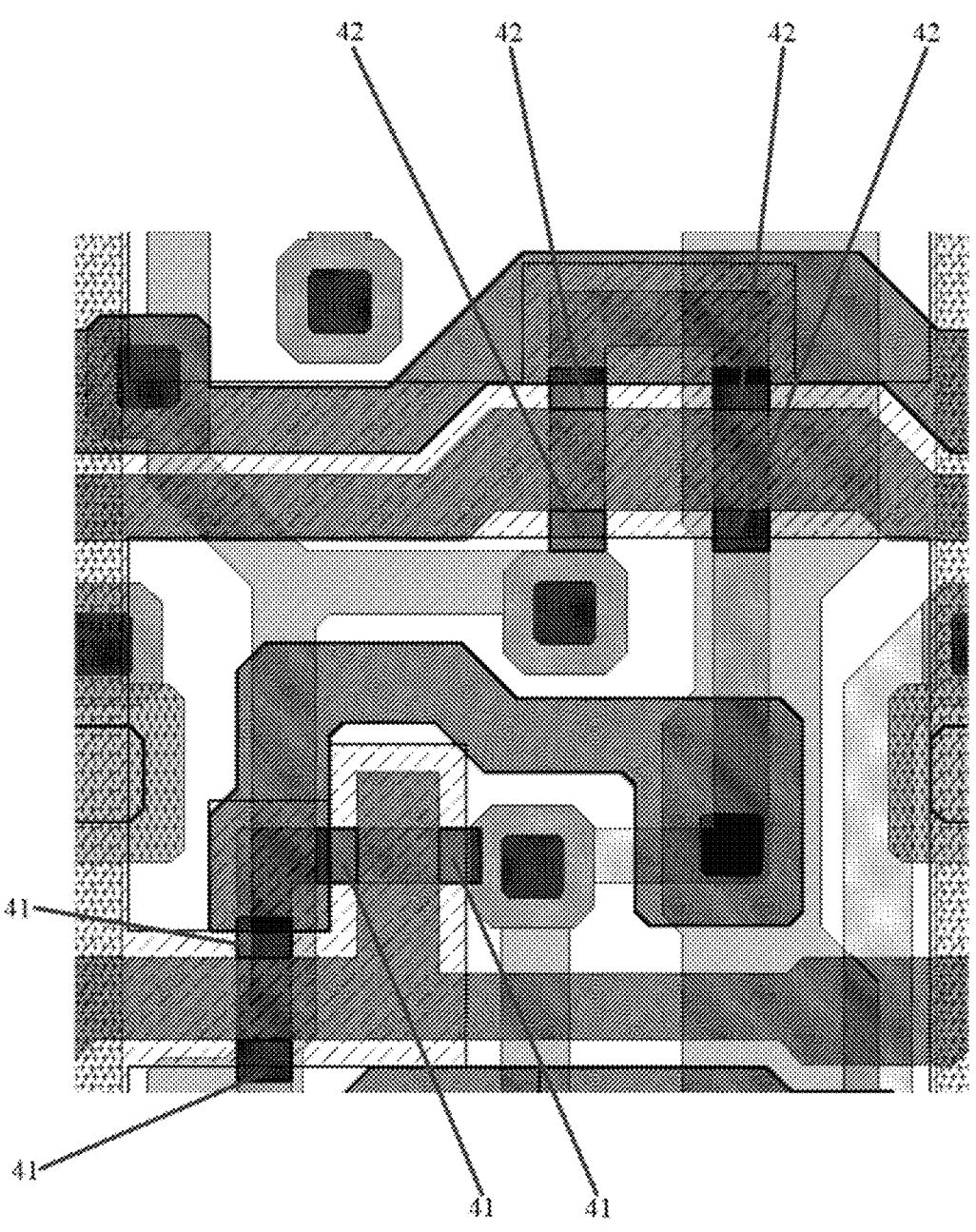
FIG. 13 is a schematic diagram of the positions of the first lightly doped region and the second lightly doped region provided by an embodiment of the present disclosure.
Figure 14:
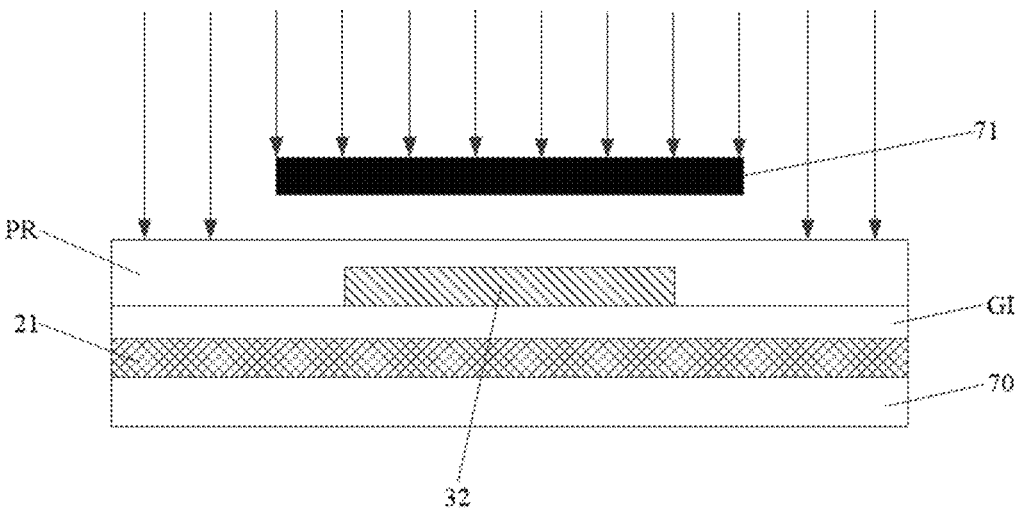
FIGS. 14 to 18 are schematic flowcharts of forming the first lightly doped region and the second lightly doped region according to the embodiments of the present disclosure.
Figure 15:
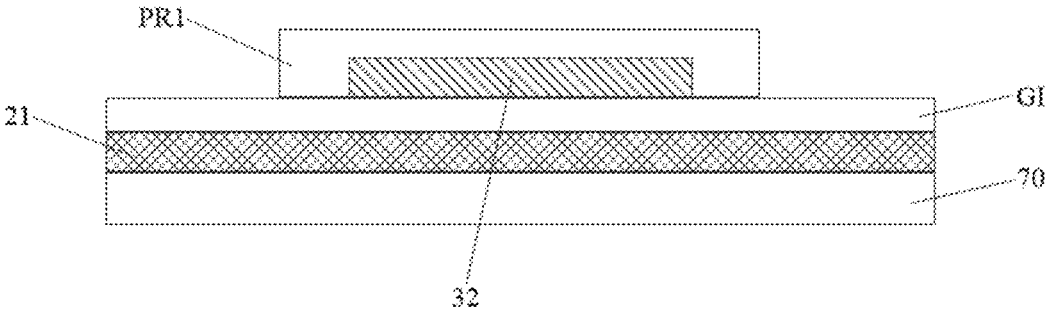

As shown in FIG. 2 and FIG. 12, in some embodiments, the data line DA is manufactured using the second source-drain metal layer in the display substrate.

The above arrangement makes the data line DA and the lower metal layer have a thicker first planarization layer, that is, the organic layer, which reduces the parasitic capacitance formed between the data line DA and the lower metal layer, and greatly weakens the affect between the data line DA and the lower metal layer, improves the crosstalk problem, increases the charging rate, and improves the display performance.

Figure 7:
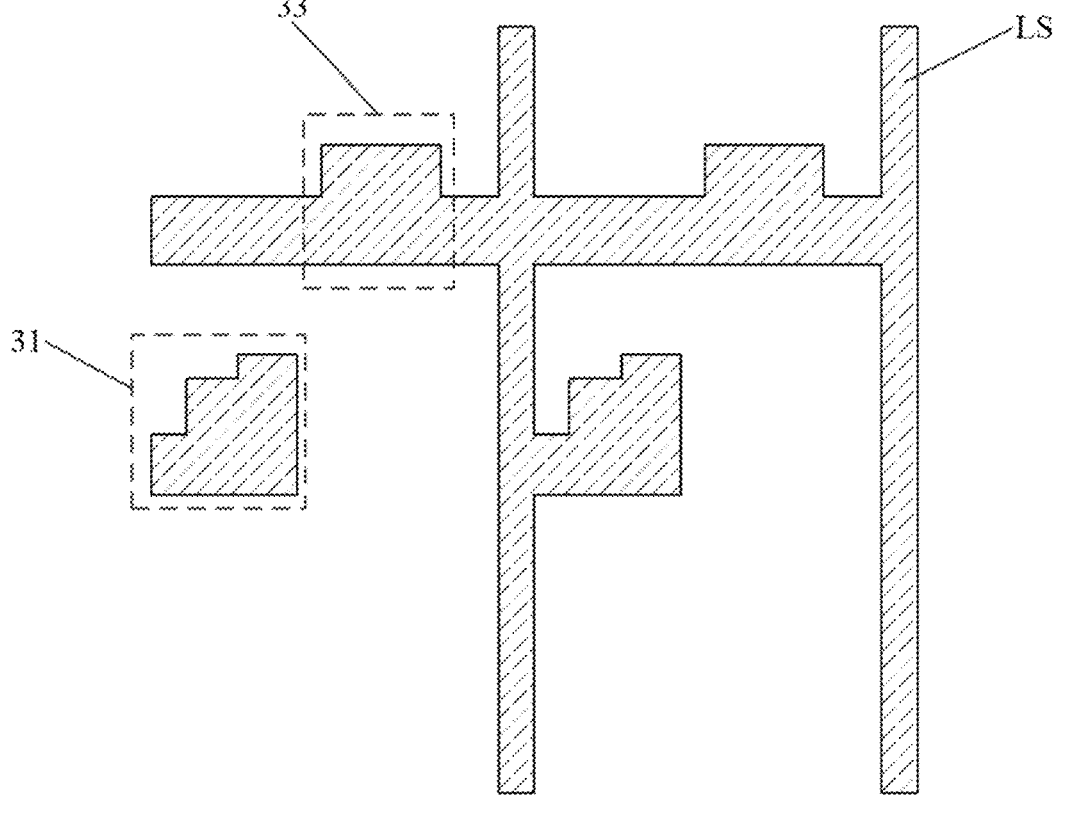
FIG. 7 is a schematic layout diagram of the light shielding layer in FIG. 2.

As shown in FIG. 2, FIG. 3 and FIG. 7, in some embodiments, the display substrate includes a light shielding layer LS, and the first light shielding portion in the light shielding layer LS is multiplexed as the first compensation gate pattern 31, the second light shielding portion in the light shielding layer LS is multiplexed as the first reset gate pattern 33.

As shown in FIG. 2, FIG. 3 and FIG. 7, in some embodiments, the display substrate further includes a display area and a peripheral area surrounding the display area; the display substrate also includes a power supply line VDD, and the power supply line VDD includes a portion located in the display area and a portion located in the peripheral area; the light shielding layer LS is coupled to the power supply line VDD in the peripheral area.

Exemplarily, the light shielding layer LS is formed in a grid structure, and in the peripheral area, there is an overlapping area between the orthographic projection of the light shielding layer LS on the base substrate and the orthographic projection of the power supply line VDD on the base substrate, and the light shielding layer LS is coupled to the power supply line VDD through a via hole located in the overlapping area.

The above arrangement can avoid the formation of one independent film layer specially used as the gate pattern. At the same time, the above setting method can also reduce the loading of the power supply line VDD, so that the display uniformity is also optimized.

The display substrate provided by the above embodiment includes: a light shielding layer LS, an insulating layer, an active layer, a first gate insulating layer, a first gate metal layer, a second gate insulating layer, a second gate metal layer, an interlayer insulating layer, a first source-drain metal layer, a first planarization layer, a second source-drain metal layer, a second planarization layer, an anode layer, a pixel defining layer, a light emitting functional layer, a cathode layer and an encapsulation layer that are stacked on the base substrate along a direction away from the base substrate. The display substrate may also include a passivation layer.

Figure 8:
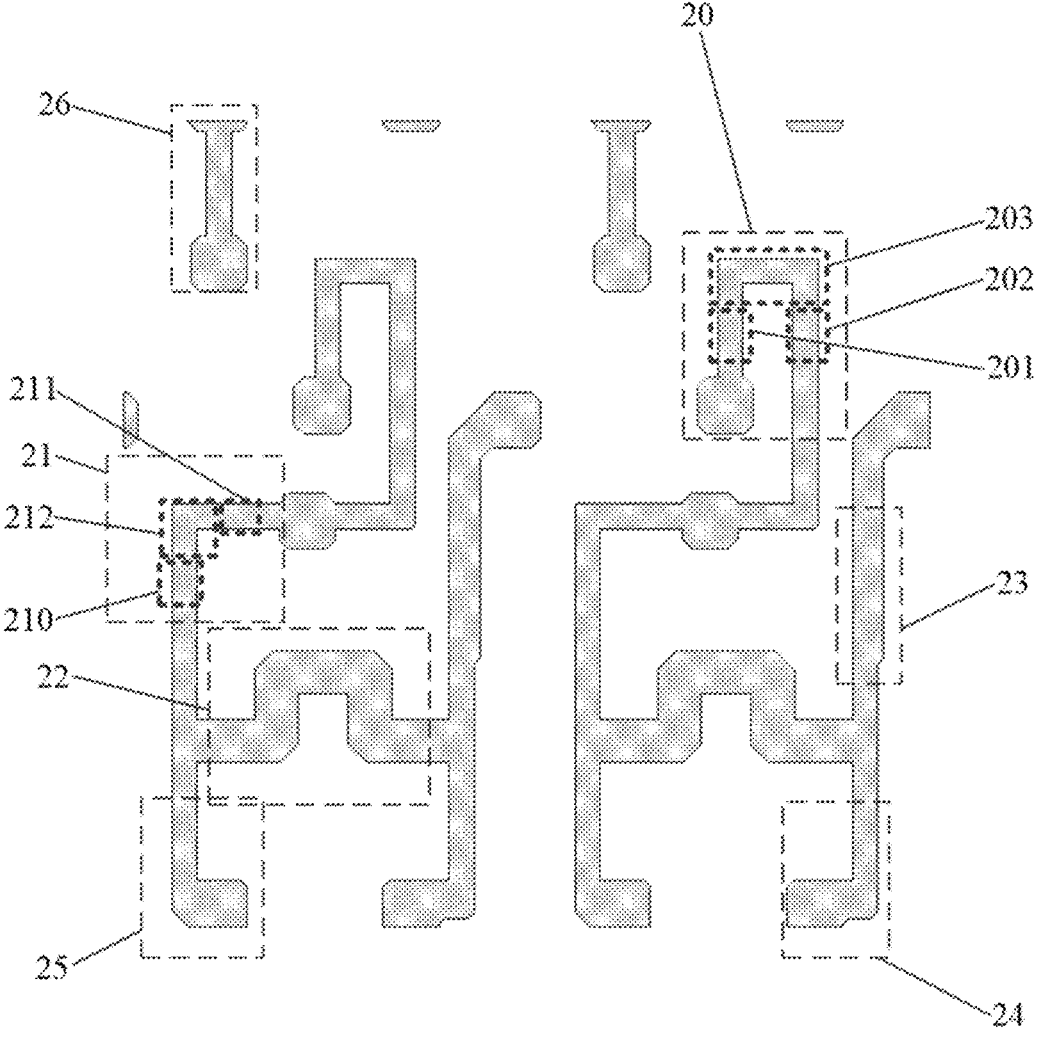
FIG. 8 is a schematic layout diagram of the active layer in FIG. 2.

As shown in FIG. 3 and FIG. 8, the active layer is used to form: the first reset active layer 20 included in the first reset transistor T1, the compensation active layer 21 included in the compensation transistor T2, a driving active layer 22 included in the driving transistor T3, a data writing-in active layer 23 included in the data writing-in transistor T4, a power supply control active layer 24 included in the power supply control transistor T5, and the light emitting control active layer 25 included in the light emitting control transistor T6, the second reset active layer 26 included in the second reset transistor T7, and some conductive structures.

Figure 9:
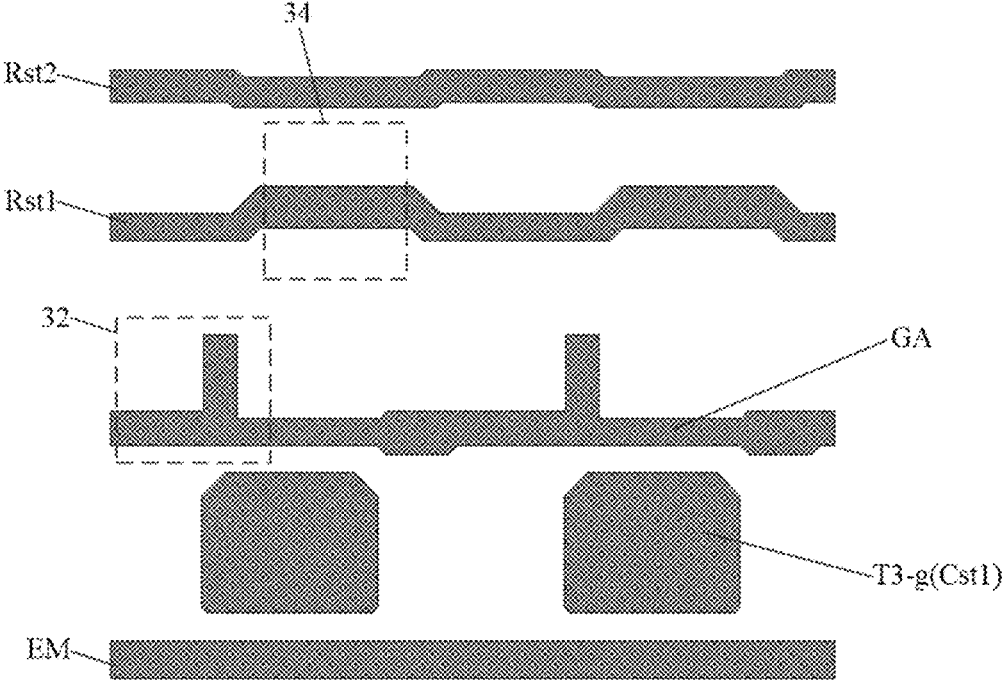
FIG. 9 is a schematic layout diagram of the first gate metal layer in FIG. 2.

As shown in FIG. 2 and FIG. 9, the first gate metal layer is used to form: the first reset line Rst1, the second reset line Rst2, the gate line GA and the light emitting control line EM, and gate electrode of each transistor.

As shown in FIG. 2 and FIG. 10, the second gate metal layer is used to form: the first initial portion 60, the second initialization signal line Vinit2, the shielding pattern 50, and the second electrode plate Cst2 of the storage capacitor Cst.

As shown in FIG. 2, FIG. 11 and FIG. 12, the first source-drain metal layer is used to form: the power supply line VDD, the second initial portion 61, the first conductive connection portion 11, the second conductive connection portion 12, the third conductive connection portion 13 and the fourth conductive connection portion 14. The first conductive connection portion 11 is used to couple the gate electrode T3-g of the driving transistor T3 and the second electrode of the compensation transistor T2. The second conductive connection portion 12 is used to couple the first electrode of the second reset transistor T7 and the second initialization signal line Vinit2. The third conductive connection portion 13 is used to couple the first electrode of the data writing-in transistor T4 and the data line DA. The fourth conductive connection portion 14 is used to couple the second electrode of the light emitting control transistor T6 and the fifth conductive connection portion 15. The fifth conductive connection portion 15 is coupled to the corresponding anode.

As shown in FIG. 12, the second source-drain metal layer is used to form: the data line DA and the fifth conductive connection portion 15.

Embodiments of the present disclosure also provide a display device, including the display substrate provided in the above embodiments.

It should be noted that the display device can be any product or component with a display function such as a TV, a monitor, a digital photo frame, a mobile phone, a tablet computer, etc., wherein the display device also includes a flexible circuit board, a printed circuit board and a back panel, etc.

In the display substrate provided by the above embodiments, the display substrate includes the first compensation gate pattern 31, and the compensation transistor T2 includes the second compensation gate pattern 32, so that the compensation transistor T2 is formed a structure including a top gate and a bottom gate. The orthographic projection of the first compensation gate pattern 31 on the base substrate at least partially overlaps the orthographic projection of the compensation channel portion on the base substrate; the orthographic projection of the second compensation gate pattern 32 on the base substrate completely covers the orthographic projection of the compensation channel portion on the base substrate; so that the second compensation gate pattern 32 can receive corresponding scanning signals and control the compensation transistor T2 to work normally, the first compensation gate pattern 31 can shield and stabilize the voltage of the compensation transistor T2. Therefore, the influence of other peripheral signals on the compensation transistor T2 is eliminated, and the leakage of the compensation transistor T2 is avoided when the display substrate is in the light emitting phase, thereby avoiding the flickering problem of the display screen applied to the display substrate when displaying at a low frequency. The display screen applied to the display substrate provided by the above embodiments has a better display effect, which greatly improves product performance. Moreover, since the first compensation gate pattern 31 can be loaded with different DC voltage signals as required, under different grayscale brightness, matching signals can be provided to the first compensation gate pattern 31 for voltage stabilization, which can prevent the compensation transistor T2 from leaking when the display substrate is in the light emitting phase.

When the display device provided by the embodiments of the present disclosure includes the above-mentioned display substrate, it also has the above-mentioned beneficial effects, which will not be repeated here.

Embodiments of the present disclosure also provide a method of manufacturing a display substrate, which is used to manufacture the display substrate provided in the above embodiments; the method includes:

forming a plurality of first compensation gate patterns 31 and a plurality of first reset gate patterns 33 included in the display substrate;

forming the compensation active layer 21 included in the compensation transistor T2 and the first reset active layer 20 included in the first reset transistor T1;

forming the second compensation gate pattern 32 included in the compensation transistor T2 and the second reset gate pattern 34 included in the first reset transistor T1;

forming a first photoresist pattern PR1 and a second photoresist pattern PR2, the first photoresist pattern PR1 covering the compensation channel portion and the first lightly doped region 41, and the second photoresist pattern PR2 covering the reset channel portion and the second lightly doped region 42;

performing a first time of doping on the compensation active layer 21 and the first reset active layer 20;

removing the first photoresist pattern PR1 and the second photoresist pattern PR2;

performing a second time of doping on the compensation active layer 21 and the first reset active layer 20.

In more detail, the manufacturing process of the display substrate is as follows:

forming an organic PI base substrate 70 on a glass substrate; depositing a light shielding metal material layer on the organic PI base substrate, covering the light shielding metal material layer with a photoresist, and then performing exposure, development, etching to obtain a light shielding layer LS. A part of the light shielding layer LS is multiplexed as the first compensation gate pattern 31 and the first reset gate pattern 33.

Forming an inorganic medium layer by depositing on the light shielding layer LS.

Depositing an active material layer on the inorganic medium layer, covering the active material layer with the photoresist, and then performing exposure, development, and etching to obtain the active layer. The active layer includes the compensation active layer 21 and the first reset active layer 20.

Continuing to deposit an inorganic medium layer on the active layer to form a first gate insulating layer.

Depositing a first gate metal material layer on the first gate insulating layer, covering the first gate metal material layer with the photoresist, and performing exposure, development, dry etching to obtain the first gate metal layer. The first gate metal layer includes a second compensation gate pattern 32 and a second reset gate pattern 34.

As shown in FIG. 14 to FIG. 18, the photoresist PR is covered on the first gate metal layer, and then the photoresist is exposed by using a mask plate 71, and then the first photoresist pattern PR1 and a second photoresist pattern PR2 are formed by developing and other processes, the first photoresist pattern PR1 covers the compensation channel portion and the first lightly doped region 41, and the second photoresist pattern PR2 covers the reset channel portion and the second lightly doped region 42.

Figure 16:
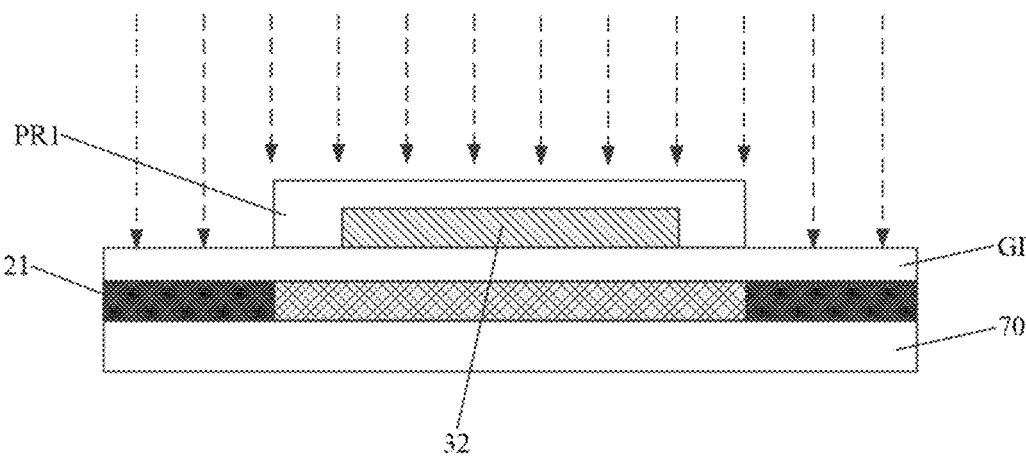
Figure 17:
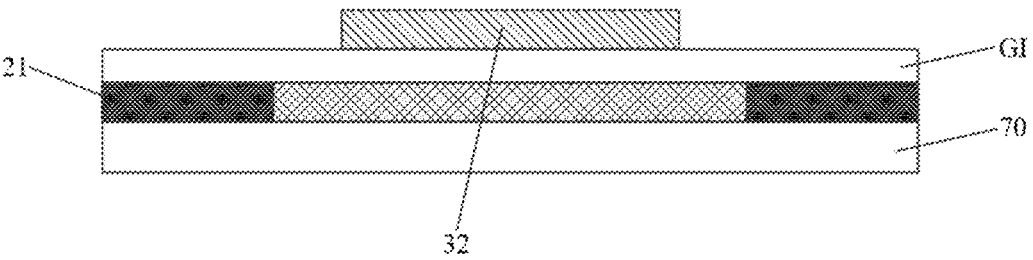
Figure 18:
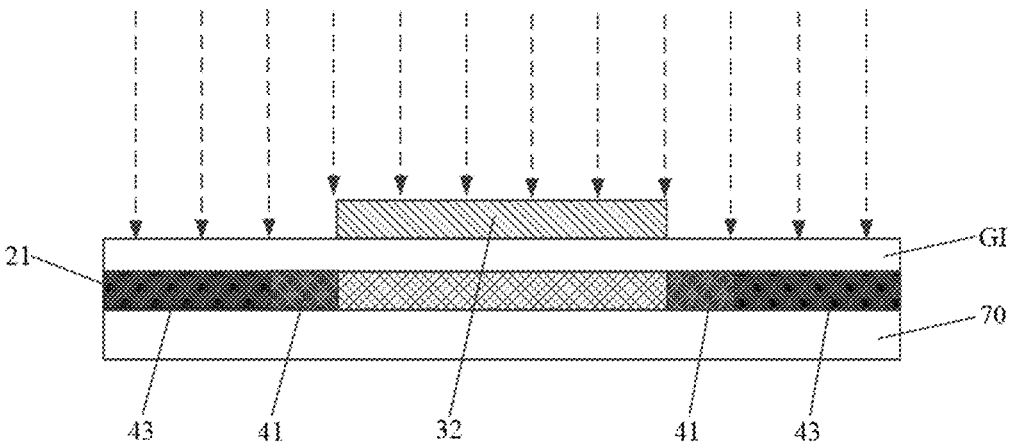

The first time of P-type doping is performed on the compensation active layer 21 and the first reset active layer 20, the first photoresist pattern PR1 and the second photoresist pattern PR2 are removed; a second time of P-type doping is performed on the compensation active layer 21 and the first reset active layer 20. During the first time of P-type doping, since the first photoresist pattern PR1 and the second photoresist pattern PR2 are used for covering, the doping concentration of the first lightly doped region 41 and the second lightly doped region 42 is less than the doping concentration of the non-first lightly doped region 43 and the non-second lightly doped region, which can prevent electric leakage. It should be noted that FIG. 16 and FIG. 18 are doping steps.

An inorganic dielectric layer is continuously to be deposited on the first gate metal layer to form a second gate insulating layer.

A second gate metal layer material layer is deposited on the second gate insulating layer, the second gate metal material layer is covered with photoresist, and then the second gate metal layer is obtained through exposure, development, dry etching and other processes.

An interlayer insulating layer is deposited and formed on the second gate metal layer, the interlayer insulating layer is covered with photoresist, and then the process of exposing, developing, dry etching and other processes are performed to realize the patterning of the interlayer insulating layer. The patterned interlayer insulating layer includes via holes, and the via holes are mainly used for coupling the first source-drain metal layer and the conductive film layer under the interlayer insulating layer.

A first source-drain metal material layer is deposited and formed on the interlayer insulating layer, the photoresist covers the first source-drain metal material layer, and then the first source-drain metal layer is obtained through processes such as exposure, development, and dry etching.

A first planarization layer is deposited and formed on the first source-drain metal layer, the first planarization layer is covered with photoresist, and then the processes such as exposure, development, and dry etching are performed to pattern the first planarization layer.

A second source-drain metal material layer is deposited and formed on the first planarization layer, the second source-drain metal material layer is covered with photoresist, and then the second source-drain metal layer is obtained through processes such as exposure, development, and dry etching.

It should be noted that the extension of the signal line along the X direction means that the signal line includes a main part and a secondary part connected to the main part, the main part is a line, a line segment or a bar shape, and the main part extends along the X direction, and the length of the main part along the X direction is greater than the length of the secondary part along other directions.

It should be appreciated that, the expression "at a same layer" refers to that the film layers are arranged on a same structural layer. Alternatively, for example, the film layers on a same layer may be layer structures formed through forming thin layers for forming specific patterns through a single-film-forming process and then patterning the film layers with a same mask through a single patterning process. Depending on different specific patterns, a single patterning process may include a plurality of exposing, development or etching processes, and the specific patterns in the layer structure may be continuous or discontinuous. These specific patterns may also be arranged at different levels or have different thicknesses.

In the embodiments of the present disclosure, the order of the steps is not limited to the serial numbers thereof. For a person skilled in the art, any change in the order of the steps shall also fall within the scope of the present disclosure if without any creative effort.

It should be further appreciated that, the above embodiments have been described in a progressive manner, and the same or similar contents in the embodiments have not been repeated, i.e., each embodiment has merely focused on the difference from the others. Especially, the method embodiments are substantially similar to the product embodiments, and thus have been described in a simple manner.

Unless otherwise defined, any technical or scientific term used herein shall have the common meaning understood by a person of ordinary skills. Such words as "first" and "second" used in the specification and claims are merely used to differentiate different components rather than to represent any order, number or importance. Similarly, such words as "one" or "one of" are merely used to represent the existence of at least one member, rather than to limit the number thereof. Such words as "include" or "including" intends to indicate that an element or object before the word contains an element or object or equivalents thereof listed after the word, without excluding any other element or object. Such words as "connect/connected to" or "couple/coupled to" may include electrical connection, direct or indirect, rather than to be limited to physical or mechanical connection. Such words as "on", "under", "left" and "right" are merely used to represent relative position relationship, and when an absolute position of the object is changed, the relative position relationship will be changed too.

It should be appreciated that, in the case that such an element as layer, film, region or substrate is arranged "on" or "under" another element, it may be directly arranged "on" or "under" the other element, or an intermediate element may be arranged therebetween.

In the above description, the features, structures, materials or characteristics may be combined in any embodiment or embodiments in an appropriate manner.

The above embodiments are for illustrative purposes only, but the present disclosure is not limited thereto. Obviously, a person skilled in the art may make further modifications and improvements without departing from the spirit of the present disclosure, and these modifications and improvements shall also fall within the scope of the present disclosure.

What is claimed is:

1. A display substrate, comprising: a base substrate, a plurality of sub-pixels arranged on the base substrate, a plurality of gate lines, and a plurality of first compensation gate patterns which are made of metal materials; wherein the sub-pixel includes a sub-pixel driving circuit, and the sub-pixel driving circuit includes: a driving transistor and a compensation transistor;

a first electrode of the compensation transistor is coupled to a second electrode of the driving transistor, and a second electrode of the compensation transistor is coupled to a gate electrode of the driving transistor; the compensation transistor includes a second compensation gate pattern, the first compensation gate pattern is located between a corresponding second compensation gate pattern and the base substrate, the first compensation gate pattern is coupled to a direct current (DC) signal output terminal, and the second compensation gate pattern is coupled to a corresponding gate line;

the compensation transistor includes a compensation active layer, the compensation active layer is located between the first compensation gate pattern and the second compensation gate pattern, and the compensation active layer includes a compensation channel portion; an orthographic projection of the first compensation gate pattern on the base substrate at least partially overlaps an orthographic projection of the compensation channel portion on the base substrate; an orthographic projection of the second compensation gate pattern on the base substrate completely covers the orthographic projection of the compensation channel portion on the base substrate.

2. The display substrate according to claim 1, wherein the orthographic projection of the first compensation gate pattern on the base substrate completely cover the orthographic projection of the compensation channel portion on the base substrate.

3. The display substrate according to claim 2, wherein the orthographic projection of the first compensation gate pattern on the base substrate surrounds the orthographic projection of the second compensation gate pattern on the base substrate.

4. The display substrate according to claim 1, wherein the compensation active layer includes a first compensation channel portion, a second compensation channel portion and a compensation connection portion, the compensation connection portion is respectively coupled to the first compensation channel portion and the second compensation channel portion;

the orthographic projection of the first compensation gate pattern on the base substrate at least partially overlaps an orthographic projection of the compensation connection portion on the base substrate.

5. The display substrate according to claim 4, wherein the compensation active layer further includes first lightly doped regions, and the first compensation channel portion is located between the first lightly doped regions, the second compensation channel portion is located between the first lightly doped regions.

6. The display substrate according to claim 4, wherein the display substrate further includes a plurality of power supply lines; the sub-pixel further includes a shielding pattern, the shielding pattern is coupled to the power supply line, and an orthographic projection of the shielding pattern on the base substrate at least partially overlaps the orthographic projection of the compensation connection portion on the base substrate.

7. The display substrate according to claim 6, wherein the sub-pixel further includes a first conductive connection portion, and the first conductive connection portion is respectively coupled to the gate electrode of the driving transistor and the second electrode of the compensation transistor;

an orthographic projection of an end of the first conductive connection portion coupled to the second electrode of the compensation transistor on the base substrate is at least partially surrounded by the orthographic projection of the shielding pattern on the base substrate.

8. The display substrate according to claim 4, wherein the display substrate further includes a first initialization signal film layer, a plurality of first reset lines, and a plurality of first reset gate patterns; the sub-pixel driving circuit further includes: a first reset transistor, a first electrode of the first reset transistor is coupled to the first initialization signal film layer, and a second electrode of the first reset transistor is coupled to the gate electrode of the driving transistor; the first reset transistor includes a second reset gate pattern, and the first reset gate pattern is located between a corresponding second reset gate pattern and the base substrate; the first reset gate pattern is coupled to the DC signal output terminal, and the second reset gate pattern is coupled to a corresponding first reset line;

the first reset transistor includes a first reset active layer, the first reset active layer is located between the first reset gate pattern and the second reset gate pattern, the first reset active layer includes a reset channel portion; the orthographic projection of the first reset gate pattern on the base substrate at least partially overlaps an orthographic projection of the reset channel portion on the base substrate; the orthographic projection of the second reset gate pattern on the base substrate completely covers the orthographic projection of the reset channel portion on the base substrate.

9. The display substrate according to claim 8, wherein the orthographic projection of the first reset gate pattern on the base substrate completely covers the orthographic projection of the reset channel portion on the base substrate, wherein the orthographic projection of the first reset gate pattern on the base substrate surrounds the orthographic projection of the second reset gate pattern on the base substrate.

10. The display substrate according to claim 8, wherein the first reset active layer includes a first reset channel portion, a second reset channel portion and a reset connection portion, the reset connection portion is respectively coupled to the first reset channel portion and the second reset channel portion;

the orthographic projection of the first reset gate pattern on the base substrate at least partially overlaps an orthographic projection of the reset connection portion on the base substrate.

11. The display substrate according to claim 10, wherein the first reset active layer further includes second lightly doped regions, and the first reset channel portion is located between the second lightly doped regions, and the second reset channel portion is located between the second lightly doped regions.

12. The display substrate according to claim 10, wherein the first initialization signal film layer includes a grid structure.

13. The display substrate according to claim 12, wherein the first initialization signal film layer includes a plurality of first initial portions and a plurality of second initial portions, and the first initial portion includes at least a portion extending along a first direction, the second initial portion includes at least a portion extending along a second direction, and the first direction intersects the second direction;

the plurality of first initial portions are arranged along the second direction, and the plurality of second initial portions are respectively coupled to the plurality of first initial portions; the first electrode of the first reset transistor is coupled to a corresponding second initial portion.

14. The display substrate according to claim 13, wherein the second initial portion includes an initial main body portion and an initial protruding portion, and the initial main body portion includes at least a portion extending along the second direction, the initial protruding portion includes at least a portion extending along the first direction; the first electrode of the first reset transistor is coupled to the initial protruding portion, wherein the initial main body portion includes a plurality of first sub-portions and a plurality of second sub-portions, the first sub-portion and the second sub-portion are arranged alternately, and the first sub-portion and the second sub-portion are at least partially staggered along the first direction;

the second sub-portion is coupled to the initial protruding portion; an orthographic projection of the second sub-portion on the base substrate at least partially overlaps the orthographic projection of the compensation channel portion on the base substrate, wherein the orthographic projection of the second sub-portion on the base substrate at least partially overlaps the orthographic projection of the compensating connection portion on the base substrate.

15. The display substrate according to claim 13, wherein the orthographic projection of the first initial portion on the base substrate at least partially overlaps the orthographic projection of the reset connection portion on the base substrate.

16. The display substrate according to claim 1, wherein the display substrate further includes a plurality of second initialization signal lines and a plurality of second reset lines; the sub-pixel driving circuit further includes a second reset transistor, a gate electrode of the second reset transistor is coupled to a corresponding second reset line, a first electrode of the second reset transistor is coupled to a corresponding second initialization signal line, and a second electrode of the second reset transistor is coupled to a corresponding light emitting element.

17. The display substrate according to claim 1, wherein the display substrate further includes a plurality of data lines, a plurality of power supply lines and a plurality of light emitting control lines;

the sub-pixel driving circuit further includes a data writing-in transistor, a power supply control transistor, a light emitting control transistor and a storage capacitor;

a gate electrode of the data writing-in transistor is coupled to a corresponding gate line, a first electrode of the data writing-in transistor is coupled to a corresponding data line, and a second electrode of the data writing-in transistor is coupled to the first electrode of the driving transistor;

a gate electrode of the power supply control transistor is coupled to a corresponding light emitting control line, a first electrode of the power supply control transistor is coupled to a corresponding power supply line, and a second electrode of the power supply control transistor is coupled to the first electrode of the driving transistor;

a gate electrode of the light emitting control transistor is coupled to the corresponding light emitting control line, a first electrode of the light emitting control transistor is coupled to the second electrode of the driving transistor, and a second electrode of the light emitting control transistor is coupled to a corresponding light emitting element;

a first electrode plate of the storage capacitor is coupled to the gate electrode of the driving transistor, and a second electrode plate of the storage capacitor is coupled to the corresponding power supply line.

18. The display substrate according to claim 8, wherein the display substrate includes a light shielding layer, and a first light shielding portion in the light shielding layer is multiplexed as the first compensation gate pattern, a second light shielding portion in the light shielding layer is multiplexed as the first reset gate pattern, wherein the display substrate further includes a display area and a peripheral area surrounding the display area; the display substrate further includes a power supply line, and the power supply line includes a portion located in the display area and a portion located in the peripheral area; the light shielding layer is coupled to the power supply line in the peripheral area.

19. A display device, comprising the display substrate according to claim 1.

20. A method of manufacturing the display substrate according to claim 1, comprising:

forming the plurality of first compensation gate patterns and a plurality of first reset gate patterns included in the display substrate;

forming the compensation active layer included in the compensation transistor and the first reset active layer included in the first reset transistor;

forming the second compensation gate pattern included in the compensation transistor and the second reset gate pattern included in the first reset transistor;

forming a first photoresist pattern and a second photoresist pattern, the first photoresist pattern covering the compensation channel portion and a first lightly doped region, and the second photoresist pattern covering the reset channel portion and a second lightly doped region;

performing a first doping on the compensation active layer and the first reset active layer;

removing the first photoresist pattern and the second photoresist pattern;

performing a second doping on the compensation active layer and the first reset active layer.

* * * * *